US007108956B2

(12) United States Patent
Oda

(10) Patent No.: US 7,108,956 B2

(45) Date of Patent: Sep. 19, 2006

(54) THERMOSENSITIVE LITHOGRAPHIC PRINTING PLATE

(75) Inventor: Akio Oda, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/610,707

(22) Filed: Jul. 2, 2003

(65) Prior Publication Data

US 2004/0131966 A1 Jul. 8, 2004

(30) Foreign Application Priority Data

| | | |
|---|---|---|
| Jul. 3, 2002 | (JP) | P. 2002-194657 |
| Sep. 10, 2002 | (JP) | P. 2002-264490 |
| Feb. 17, 2003 | (JP) | P. 2003-038525 |
| Feb. 17, 2003 | (JP) | P. 2003-038526 |

(51) Int. Cl.
*G03F 7/09* (2006.01)
*G03F 7/11* (2006.01)

(52) U.S. Cl. .............................. 430/270.1; 430/271.1; 430/272.1; 430/302; 101/453

(58) Field of Classification Search ............ 430/270.1, 430/271.1, 272.1, 302; 101/453
See application file for complete search history.

(56) References Cited

U.S. PATENT DOCUMENTS

| | | | | |
|---|---|---|---|---|
| 6,242,156 B1 | | 6/2001 | Teng | |
| 6,340,815 B1 | * | 1/2002 | Verschueren et al. | 250/318 |
| 2003/0108814 A1 | * | 6/2003 | Miyake et al. | 430/271.1 |

FOREIGN PATENT DOCUMENTS

| | | | | |
|---|---|---|---|---|
| EP | 909 657 | A2 | * | 4/1999 |
| EP | 0 950 516 | A1 | * | 10/1999 |
| EP | 0 997 272 | A1 | | 5/2000 |
| EP | 1 211 065 | A2 | | 6/2002 |
| EP | 1 211 065 | A3 | | 6/2004 |
| JP | 10 250255 | A | | 9/1998 |
| JP | 11 218914 | A | | 8/1999 |

* cited by examiner

*Primary Examiner*—Barbara L. Gilliam
(74) *Attorney, Agent, or Firm*—Sughrue Mion, PLLC

(57) ABSTRACT

A thermosensitive lithographic printing plate comprising: a hydrophilic support; a lower layer comprising a water-insoluble and alkali-soluble resin; and an upper thermosensitive layer comprising a water-insoluble and alkali-soluble resin and an infrared absorbing dye, whose dissolution in an alkaline aqueous solution increases upon exposure, wherein a surface of the upper thermosensitive layer has protrusions caused by ununiformity of thickness of the upper thermosensitive layer in a proportion of 0.1 or more and not more than 7 per $\mu m^2$ or the upper thermosensitive layer comprises at least two alkali-soluble resins having a different dissolution speed in an alkaline aqueous solution from each other, and the at least two alkali-soluble resin cause phase separation from each other.

9 Claims, No Drawings

THERMOSENSITIVE LITHOGRAPHIC PRINTING PLATE

FIELD OF THE INVENTION

The present invention relates to an image recording material that can be used as an offset printing master, especially to a thermosensitive lithographic printing plate for so-called direct plate making in which plate making can be performed directly from digital signals of computers, etc.

BACKGROUND OF THE INVENTION

In recent years, development of lasers is remarkable. In particular, with respect to solid lasers or semiconductor lasers having an emitting region in near infrared to infrared wavelengths, high-output and small-sized products have become easily available. These lasers are very useful as exposure sources during direct plate making from digital data of computers, etc.

Positive working lithographic printing plate materials for infrared laser contain an alkaline aqueous solution-soluble binder resin and an infrared absorbing dye (IR dye) that absorbs light to generate a heat as essential components. In unexposed areas (image areas), the IR dye acts as a dissolution inhibitor to substantially lower dissolution of the binder resin due to a mutual action with the binder resin, whereas in exposed areas (non-image areas), it is dissolved in an alkaline developing solution because its mutual action with the binder resin is weakened due to the generated heat, thereby forming a lithographic printing plate.

However, in such positive working lithographic printing plate precursors for infrared laser, it cannot be said that under various conditions of use, a difference between dissolution resistance of unexposed areas (image areas) to developing solutions and dissolution of exposed areas (non-image areas) in developing solutions is sufficient, and there was involved a problem such that excessive development or development failure likely occurs due to changes in conditions of use. Further, since image forming ability of lithographic printing plate relies upon heat generation of infrared laser exposure on the recording layer surface, there was involved another problem such that in the vicinity of a support, image formation is insufficient due to diffusion of the heat, i.e., the amount of heat to be used for solubilizing the recording layer becomes low, whereby a difference between exposed areas and unexposed areas becomes small, leading to insufficient reproducibility of highlights.

For example, development latitude was not substantially problematic in positive working lithographic printing plate materials undergoing plate making by UV exposure, i.e., conventional lithographic printing plate materials containing an alkaline aqueous solution-soluble binder resin and an onium salt or a quinonediazide compound and having a function such that in unexposed areas (image areas), the onium slat or quinonediazide compound acts as dissolution inhibitor due to a mutual action with the binder resin, whereas in exposed areas (non-image areas), it is decomposed by light to generate an acid and act as a dissolution accelerator.

On the other hand, in positive working lithographic printing plate materials for infrared laser, an infrared absorber acts only as a dissolution inhibitor of unexposed areas (image areas) but does not accelerate dissolution of exposed areas (non-image areas). Accordingly, in positive working lithographic printing plate materials, for ensuring sufficient sensitivity, it is necessary to previously use binder resins having high dissolution in alkaline developing solutions such that dissolution of the exposed areas is high. As a result, dissolution of unexposed areas also becomes high. Accordingly, when the surface is rubbed to form scuffs, dissolution resistance is poor so that scars are visualized as film diminishment.

On the other hand, for suppressing film diminishment due to scuffs on the surface, it is necessary to take measures for lowering dissolution of the photosensitive layer, leading to reduction of the sensitivity. Accordingly, there is a problem such that sensitivity and scuffing resistance are inconsistent with each other.

In addition, for solving such problems, JP-A-10-250255 discloses that a thermosensitive layer whose change in dissolution during image formation is large is provided in an upper layer, whereas a layer having high alkali dissolution is provided in a lower layer. According to the technology of JP-A-10-250255, an improving effect is found, but consistence between the sensitivity and the scuffing resistance does not reach a satisfactory level yet.

On the other hand, with respect to multilayer positive working lithographic printing plate materials for infrared laser, JP-A-11-218914 discloses a multilayer photosensitive image forming material utilizing a binder having a specific structure in a lower layer. However, JP-A-11-218914 does not mention scuffing resistance at all. Further, U.S. Pat. No. 6,242,156 discloses a lithographic printing plate with low tackiness and excellent block resistance, containing a radiation-sensitive layer having a roughness (Ra), caused by unevennesses of a support, of 0.2 microns or more. However, U.S. Pat. No. 6,242,156 is concerned with a so-called non-processing type and does not describe any working examples regarding a thermal positive working type.

Further, it is disclosed in JP-A-11-218914 to provide an infrared laser image forming material for direct plate making having good development latitude, in which a photosensitive layer has a two-layer structure, and low image forming property is improved by a recording layer having a devised alkaline aqueous solution-soluble high-molecular compound in a lower layer thereof. However, improvement of the alkali-soluble resin in the lower layer is insufficient. With respect to the image forming property, improvement of the upper layer portion is necessary.

Moreover, European Patent No. 997,272 discloses a multilayer positive working lithographic printing plate material for infrared laser containing a block copolymer in an upper layer.

SUMMARY OF THE INVENTION

An object of the invention is to provide a thermosensitive lithographic printing plate for direct plate making, having excellent development latitude during image formation and having high sensitivity and excellent scuffing resistance.

The present inventor made extensive and intensive investigations. As a result, it has been found that the foregoing object can be attained by containing a specific number of fine protrusions on the surface of an upper thermosensitive layer of a thermosensitive lithographic printing plate.

Specifically, the invention can be attained by the following constructions.

(1) A thermosensitive lithographic printing plate comprising a hydrophilic support having thereon a lower layer containing a water-insoluble and alkali-soluble resin and an upper thermosensitive layer containing a water-insoluble and alkali-soluble resin and an infrared absorbing dye whose dissolution in an alkaline aqueous solution increases upon exposure, wherein fine protrusions caused by ununiformity of thickness of the upper thermosensitive layer are contained in a proportion of 0.1 or more and not more than 7 per $\mu m^2$ on the surface of the upper thermosensitive layer.

(2) The thermosensitive lithographic printing plate as set forth above in (1), wherein a granular substance is contained in the upper thermosensitive layer as measures for forming fine protrusions caused by ununiformity of thickness of the upper thermosensitive layer on the surface of the upper thermosensitive layer.

(3) The thermosensitive lithographic printing plate as set forth above in (1) or (2), wherein the upper thermosensitive layer contains an alkali-soluble resin the same as in the alkali-soluble resin contained in the lower layer.

In a thermosensitive lithographic printing plate having a lower layer containing a water-insoluble and alkali-soluble resin and an upper thermosensitive layer containing a water-insoluble and alkali-soluble resin and an infrared absorbing dye whose dissolution in an alkaline aqueous solution increases upon exposure, by making the upper thermosensitive layer thin, sensitivity can be more enhanced, but on the other hand, scuffing resistance is lowered. When the upper thermosensitive layer whose sensitivity is lowered by enhancement of the scuffing resistance is made thick, the sensitivity is lowered. That is, in such thermosensitive lithographic printing plates, the sensitivity and the scuffing resistance were in the actual situation of tradeoff.

However, in the thermosensitive lithographic printing plate of the invention, by containing fine protrusions caused by unevennesses of the upper thermosensitive layer in a proportion of 0.1 or more and not more than 7 per $\mu m^2$ on the surface of the upper thermosensitive layer, both the sensitivity and the scuffing resistance could be enhanced.

This action mechanism is not always clear. However, it may be supposed that by containing fine protrusions caused by unevennesses of the upper thermosensitive layer on the surface of the upper thermosensitive layer, the same effect as in the case where the upper thermosensitive layer is made thick in a pseudo manner is obtained, thereby enhancing the scuffing resistance, and there is no worry about reduction in the sensitivity because the sensitivity replies upon thickness of a valley portion between the protrusions.

Further, the present inventor made extensive and intensive investigations. As a result, it has been found as an another aspect that the foregoing object can be attained by adding at least two kinds of alkali-soluble resins having a different dissolution speed in an alkaline aqueous solution from each other, both of which cause phase separation from each other, in an upper thermosensitive layer of a thermosensitive lithographic printing plate.

Specifically, the another aspect of the invention can be attained by the following construction.

A thermosensitive lithographic printing plate comprising a hydrophilic support having thereon a lower layer containing a water-insoluble and alkali-soluble resin and an upper thermosensitive layer containing a water-insoluble and alkali-soluble resin and an infrared absorbing dye whose dissolution in an alkaline aqueous solution increases upon exposure, wherein the upper thermosensitive layer has at least two kinds of alkali-soluble resins having a different dissolution speed in an alkaline aqueous solution from each other, and the at least two kinds of alkali-soluble resin cause phase separation from each other.

The reason why the construction of the invention can attain high sensitivity resides in the matter that a resin having a higher dissolution speed in an alkaline aqueous solution, which is added in an upper thermosensitive layer and is present in a phase separation state, accelerates dissolution in a developing solution in exposed areas. The reason why phase separation is necessary resides in the matter that if resins having a different dissolution speed are uniformly compatibilized each other, alkali resistance in unexposed areas is lowered. In the phase separation state, since in unexposed areas, a resin having a higher dissolution speed in an alkaline aqueous solution is less in opportunity to come into contact with a developing solution, it is possible to ensure alkali resistance in unexposed areas by a resin having a lower dissolution speed in an alkaline aqueous solution.

DETAILED DESCRIPTION OF THE INVENTION

The invention will be described below in detail.

In the thermosensitive lithographic printing plate of the invention, a thermosensitive layer is characterized by having a laminate structure, having an upper thermosensitive layer provided in a position near the surface (exposed surface) and a lower layer containing an alkali-soluble resin provided in the side near a support, and preferably containing fine protrusions caused by ununiformity of thickness of the upper thermosensitive layer in a proportion of 0.1 or more and not more than 7 per $\mu m^2$ on the surface of the upper thermosensitive layer.

As measures for forming such protrusions, there is a method in which fine particles are added to the upper layer, thereby containing a granular substance therein. The fine particles to be added may be inorganic particles, metallic particles, or organic particles.

Examples of inorganic particles include metal oxides such as iron oxide, zinc oxide, titanium dioxide, and zirconia; silicon-containing oxides having no absorption in a visible region themselves, called white carbon, such as silicic anhydride, hydrated calcium silicate, and hydrated aluminum silicate; and clay mineral particles such as clay, talc, kaolin, and zeolite. Further, examples of metallic particles include iron, aluminum, copper, nickel, and silver.

The inorganic particles or metallic particles have a mean particle size of not more than about 1 μm, preferably from 0.01 to 1 μm, and more preferably from 0.05 to 0.2 μm. When the mean particle size of the inorganic particles or metallic particles is less than 0.01 μm, formation of unevennesses is insufficient so that no effect against scuffing resistance is revealed. On the other hand, when it exceeds 1 μm, resolution of printed matters is likely deteriorated, adhesion to the lower layer is likely deteriorated, or particles in the vicinity of the surface are liable to drop out.

The content of the inorganic particles or metallic particles is preferably from about 1 to 30% by volume, and more preferably from 2 to 20% by volume based on the whole of solid contents of the upper thermosensitive layer. When the content of the inorganic particles or metallic particles is less than 1% by volume, formation of unevennesses is insufficient so that no effect against scuffing resistance is revealed. On the other hand, when it exceeds 30% by volume, strength of the upper thermosensitive layer is lowered, leading to reduction of printing resistance.

With respect to the organic particles, there are no particular limitations, but resin particles can be used as granular organic particles. The following points must be noticed during use. When a solvent is used during dispersing resin particles, it is necessary to select resin particles that are insoluble in that solvent, or to select solvents that do not dissolve resin particles therein. It is necessary to select materials that are not melted, deformed or decomposed by heat when the resin particles are dispersed or coated. Crosslinked resin particles can be preferably used as materials capable of reducing such points to notice.

The organic particles preferably have a mean particle size of from about 0.01 to 1 μm, and more preferably from 0.05 to 0.2 μm.

The content of the organic particles is preferably from about 1 to 30% by volume, and more preferably from 2 to 20% by volume based on the whole of solid contents of the upper thermosensitive layer.

Examples of organic particles include polystyrene particles and silicone resin particles. Examples of crosslinked resin particles include microgels comprising two or more ethylenically unsaturated monomers, crosslinked resin particles comprising styrene and divinylbenzene, and crosslinked resin particles comprising methyl methacrylate and diethylene glycol dimethacrylate, namely, microgels of acrylic resins, crosslinked polystyrenes, and crosslinked methyl methacrylates. These organic particles are prepared by general methods such as emulsion polymerization, soap-free emulsion polymerization, seed emulsion polymerization, dispersion polymerization, and suspension polymerization.

As another measure for forming protrusions, there can be employed a method of using a blend of a high-molecular compound to be used in the upper thermosensitive layer with two or more kinds of phase-separating high-molecular compounds. The phase-separating high-molecular compounds are uniformly dissolved in a solution but cause separation during coating and drying, whereby high-molecular compounds in the side of a low addition amount cause phase separation spherically to bring about the same effect as in the case where particles are added. As specific combinations of high-molecular compounds causing phase separation from each other, are preferable combinations of phenolic hydroxyl group-containing high-molecular compounds with sulfonamide group-containing high-molecular compounds.

Examples of phenolic hydroxyl group-containing high-molecular compounds include novolak resins such as phenol-formaldehyde resins, m-cresol-formaldehyde resins, p-cresol-formaldehyde resins, m-/p-mixed cresol-formaldehyde resins, and phenol/cresol (any of m-, p-, or m-/p-mixture) mixed formaldehyde resins, and pyrrogallol acetone resin. Besides, high-molecular compounds having a phenolic hydroxyl group in the side chains thereof are also preferable as the phenolic hydroxyl group-containing high-molecular compounds. Examples of high-molecular compounds having a phenolic hydroxyl group in the side chains thereof include high-molecular compounds obtained by homopolymerizing a polymerizable monomer comprising a low-molecular compound containing at least one of each of a phenolic hydroxyl group and a polymerizable unsaturated bond, or copolymerizing such a polymerizable monomer with other polymerizable monomer.

Examples of alkali-soluble sulfonamide group-containing high-molecular compounds include high-molecular compounds obtained by homopolymerizing a sulfonamide group-containing polymerizable monomer or copolymerizing such a polymerizable monomer with other polymerizable monomer. Examples of sulfonamide group-containing polymerizable monomers include polymerizable monomers comprising a low-molecular compound containing at least one of each of a sulfonamide group, $—NH—SO_2—$ having at least one hydrogen atom bonded on the nitrogen atom in one molecule and a polymerizable unsaturated bond. Of these are preferable low-molecular compounds containing an acryloyl group, an allyl group or a vinyloxy group, and an unsubstituted or mono-substituted aminosulfonyl group or a substituted sulfonylimino group.

A mixing ratio of the sulfonamide group-containing high-molecular compound to the phenolic hydroxyl group-containing high-molecular compound is preferably from 1/99 to 40/60, and more preferably from 5/95 to 30/70. It is preferred that the sulfonamide group-containing high molecular compound is a component in the smaller side.

As a still another measure for forming protrusions, there can be employed a method in which by partially eluting the alkali-soluble resin in the lower layer with a coating solvent during coating the upper thermosensitive layer, when the upper thermosensitive layer becomes a dry film, the alkali-soluble resin eluted from the lower layer causes phase separation from the alkali-soluble resin in the upper thermosensitive layer and becomes spherical, thereby bringing about the same effect as in the case where particles are added. In this case, similar to the above-described method of causing phase separation of two or more kinds of alkali-soluble resins, combinations of phenolic hydroxyl group-containing high-molecular compounds with sulfonamide group-containing high-molecular compounds are preferable. It is desired to select phenolic hydroxyl group-containing high-molecular compounds as the alkali-soluble resin of the upper thermosensitive layer and sulfonamide group-containing high-molecular compounds as the alkali-soluble resin of the lower layer, respectively.

The matter that unevennesses are formed as surface protrusions in the upper thermosensitive layer is important as definition of protrusions as referred to herein. Unevennesses of the support and those of the lower layer are not included in the protrusions as defined in the invention. In general, protrusions can be discriminated by microscopic photographs of the section. Further, it is preferred that the protrusions have a height of at least 0.05 μm, but the invention is not always limited thereto.

The number of protrusions is required to be from 0.1 or more and not more than 7 per $μm^2$, and preferably 0.2 or more and not more than 3 per $μm^2$.

[Alkali-soluble Resin]

In the invention, the water-insoluble and alkali-soluble high-molecular compound (hereinafter sometimes referred to as "alkali-soluble high-molecular compound") that is used in the upper thermosensitive layer and the lower layer includes homopolymers containing an acid group in the main chain and/or side chains in the polymeric molecule thereof, and copolymers thereof or mixtures thereof. Accordingly, the upper thermosensitive layer and the lower layer according to the invention have a characteristic such that when they are brought into contact with an alkaline developing solution, they are dissolved therein.

The invention is characterized in that an upper thermosensitive layer has at least two kinds of alkali-soluble resins having a different dissolution speed in an alkaline aqueous solution from each other and that the alkali-soluble resins cause phase separation from each other.

The dissolution speed of alkali-soluble resin is measured as a dissolution speed in an alkaline aqueous solution having a pH of 10 or more, and preferably a developing solution to be used. It is important to measure the dissolution speed in a state of coating film. With respect to the measurement method, it is possible to measure the dissolution speed by coating an alkali-soluble resin on a substrate having a mirror surface and reflecting a laser light to detect a cycle of interference wave.

Any ratio of dissolution speed in an alkaline aqueous solution between two kinds of alkali-soluble high-molecular compounds to be used in the upper thermosensitive layer can be employed so far as the dissolution speed is different. The ratio is preferably from 1.05 to 50, and particularly preferably from 1.1 to 10.

As alkali-soluble high-molecular compounds to be used herein, conventionally known ones can be used without particular limitations. Preferred examples include high-molecular compounds containing any one functional group of (1) a phenolic hydroxyl group, (2) a sulfonamide group, and (3) an active imido group in the molecule thereof.

However, the high-molecular compound to be used in one side of the upper thermosensitive layer desirably has a phenolic hydroxyl group from the viewpoint of having excellent image forming property upon exposure with, for example, infrared laser. Further, the high-molecular compound to be used in the other side of the upper thermosensitive layer desirably has a sulfonamide group or an active imido group for the purpose of forming unevennesses on the surface due to phase separation.

Specific examples will be given below, but it should not be construed that the invention is limited thereto.

(1) Examples of phenolic hydroxyl group-containing high-molecular compounds include novolak resins such as phenol-formaldehyde resins, m-cresol-formaldehyde resins, p-cresol-formaldehyde resins, m-/p-mixed cresol-formaldehyde resins, and phenol/cresol (any of m-, p-, or m-/p-mixture) mixed formaldehyde resins, and pyrrogallol acetone resin. Besides, high-molecular compounds having a phenolic hydroxyl group in the side chains thereof are also preferable as the phenolic hydroxyl group-containing high-molecular compounds. Examples of high-molecular compounds having a phenolic hydroxyl group in the side chains thereof include high-molecular compounds obtained by homopolymerizing a polymerizable monomer comprising a low-molecular compound containing at least one of each of a phenolic hydroxyl group and a polymerizable unsaturated bond, or copolymerizing such a polymerizable monomer with other polymerizable monomer.

Examples of phenolic hydroxyl group-containing polymerizable monomers include acrylamides, methacrylamides, acrylic esters, methacrylic esters, and hydroxystyrenes each containing a phenolic hydroxyl group. Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate can be suitably used. Such phenolic hydroxyl group-containing resins may be used in combination of two or more thereof.

Further, polycondensates of a phenol containing an alkyl group having from 3 to 8 carbon atoms as a substituent and formaldehyde, such as t-butyl phenol-formaldehyde resins and octyl phenol-formaldehyde resins, as disclosed in U.S. Pat. No. 4,123,279, may be used jointly.

(2) Examples of alkali-soluble sulfonamide group-containing high-molecular compounds include high-molecular compounds obtained by homopolymerizing a sulfonamide group-containing polymerizable monomer or copolymerizing such a polymerizable monomer with other polymerizable monomer. Examples of sulfonamide group-containing polymerizable monomers include polymerizable monomers comprising a low-molecular compound containing at least one of each of a sulfonamide group, —NH—$SO_2$— having at least one hydrogen atom bonded on the nitrogen atom in one molecule and a polymerizable unsaturated bond. Of these are preferable low-molecular compounds containing an acryloyl group, an allyl group or a vinyloxy group, and a unsubstituted or mono-substituted aminosulfonyl group or a substituted sulfonylimino group.

(3) As alkali-soluble high-molecular compounds containing an active imido group, are preferable those containing an active imido group in the molecule thereof. Examples of such high-molecular compounds include high-molecular compounds obtained by homopolymerizing a polymerizable monomer comprising a low-molecular compound containing at least one of each of an active imido group and a polymerizable unsaturated bond in one molecule thereof, or copolymerizing such a polymerizable monomer with other polymerizable monomer.

Specific examples of such compounds that can be suitably used include N-(p-toluenesulfonyl) methacrylamide and N-(p-toluenesulfonyl) acrylamide.

As the monomer component that is copolymerized with the phenolic hydroxyl group-containing polymerizable monomer, sulfonamide group-containing polymerizable monomer or active imido group-containing polymerizable monomer, the following compounds (m1) to (m12) can be enumerated, but it should not be construed that the invention is limited thereto.

(m1) Acrylic esters and methacrylic esters containing an aliphatic hydroxyl group, such as 2-hydroxyethyl acrylate and 2-hydroxyethyl methacrylate.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl acrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamides and methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, and N-ethyl-N-phenyl acrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, butyl butyrate, and vinyl benzoate.

(m7) Styrenes such as styrene, α-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-Vinylpyrrolidone, acrylonitrile, methacrylonitrile, etc.

(m11) Unsaturated imides such as maleimide, N-acryloyl acrylamide, N-acetyl methacrylamide, N-propionyl methacrylamide, and N-(p-chlorobenzoyl) methacrylamide.

(m12) Unsaturated carboxylic acids such as acrylic acid, methacrylic-acid, maleic anhydride, and itaconic acid.

Preferred examples of phenolic hydroxyl group-containing alkali-soluble high-molecular compounds include novolak resins such as phenol-formaldehyde resins, m-cresol-formaldehyde resins, p-cresol-formaldehyde resins, m-/p-mixed cresol-formaldehyde resins, and phenol/cresol (any of m-, p-, or m-/p-mixture) mixed formaldehyde resins, and pyrrogallol acetone resin.

Further, polycondensates of a phenol containing an alkyl group having from 3 to 8 carbon atoms as a substituent and formaldehyde, such as t-butyl phenol-formaldehyde resins and octyl phenol-formaldehyde resins, as disclosed in U.S. Pat. No. 4,123,279, may be used jointly.

In the invention, in the case where the alkali-soluble high-molecular compound is a homopolymer or copolymer of the for going phenolic hydroxyl group-containing polymerizable monomer, sulfonamide group-containing polymerizable monomer or active imido group-containing polymerizable monomer, those having a weight average molecular weight (Mw) of 2,000 or more and a number average molecular weight (Mn) of 500 or more are preferable.

Further, those having a weight average molecular weight of from 5,000 to 300,000, a number average molecular weight of from 800 and 250,000, and a degree of dispersion (Mw/Mn) of from 1.1 to 10 are more preferable.

Moreover, in the invention, in the case where the alkali-soluble high-molecular compound is a resin such as phenol-formaldehyde resins and cresol-formaldehyde resins, those having a weight average molecular weight (Mw) of from 500 to 20,000 and a number average molecular weight (Mn) of from 200 to 10,000 are preferable.

In at least two kinds of alkali-soluble resins to be used in the upper thermosensitive layer, it is desired that at least one alkali-soluble resin is a phenolic hydroxyl group-containing resin. This is because such a phenolic hydroxyl group-containing resin is excellent from the standpoint that in the upper thermosensitive layer, strong hydrogen bonding property takes place in unexposed areas, and a part of the hydrogen bond is readily released in exposed areas. More preferably, novolak resins can be enumerated. Further, in at least two kinds of alkali-soluble resins to be used in the upper thermosensitive layer, it is desired that at least one alkali-soluble resin is an acrylic resin. This is because such an acrylic resin is low in compatibility with phenolic hydroxyl group-containing resins. More preferably, sulfonamide group-containing acrylic resins can be enumerated.

The at least two kinds of alkali-soluble high-molecular compounds in the upper thermosensitive layer are used in an addition amount of from 50 to 90% by weight in total.

When the addition amount of the alkali-soluble high-molecular compounds is less than 50% by weight, durability of the thermosensitive layer is deteriorated, whereas when it exceeds 90% by weight, both sensitivity and durability are not satisfactory.

Further, a mixing ratio of two kinds of alkali-soluble high-molecular weight having a different dissolution speed in an alkaline aqueous solution is free. However, a mixing ratio of an alkali-soluble resin having a lower dissolution speed to an alkali-soluble resin having a higher dissolution speed is preferably from 50/50 to 99/1, and more preferably from 70/30 to 97/3 on a weight basis. Incidentally, the side of a low mixing ratio is of an alkali-soluble resin having a higher dissolution speed.

Preferably, in the alkali-soluble high-molecular compounds, a phenolic hydroxyl group-containing alkali-soluble high-molecular compound in which strong hydrogen bonding property takes place in unexposed areas, and a part of the hydrogen bond is readily released in exposed areas is used in an amount of from 60% by weight to 99.8% by weight.

When the amount of the phenolic hydroxyl group-containing alkali-soluble high-molecular compound is less than 60% by weight, image forming property is lowered, whereas when it exceeds 99.8% by weight, the effects of the invention cannot be expected.

Incidentally, it is preferred that the alkali-soluble high-molecular compounds to be used in the invention are identical with each other between the upper thermosensitive layer and the lower layer.

[Infrared Absorbing Dye]

In the invention, with respect to the infrared absorbing dye to be used in the thermosensitive layer, any dyes capable of absorbing infrared ray to generate heat can be used without particular limitations, and various dyes known as infrared absorbing dyes can be used.

As the infrared absorbing dye according to the invention, commercially available dyes and known dyes as described in literatures (such as *Senryo Binran* (Handbook of Dyes), edited by The Society of Synthetic organic Chemistry, Japan, published in 1970) can be utilized. Specific examples include azo dyes, metal complex salt azo dyes, pyrazolone azo dyes, anthraquinone dyes, phthalocyanine dyes, carbonium dyes, quinoneimine dyes, methine dyes, and cyanine dyes. In the invention, of these dyes, dyes capable of absorbing infrared ray or near infrared ray are particularly preferable because they are suitable for utilization in lasers emitting infrared ray or near infrared ray.

Examples of such dyes capable of absorbing infrared ray or near infrared ray include cyanine dyes as described in JP-A-58-125246, JP-A-59-84356, JP-A-59-202829, and JP-A-60-78787; methine dyes as described in JP-A-58-173696, JP-A-58-181690, and JP-A-58-194595; naphthoquinone dyes as described in JP-A-58-112793, JP-A-58-224793, JP-A-59-48187, JP-A-59-73996, JP-A-60-52940, and JP-A-60-63744; squarilium coloring matters as described in JP-A-58-112792; and cyanine dyes as described in British Patent No. 434,875.

Further, near infrared absorbing sensitizers as described in U.S. Pat. No. 5,156,938 are suitably used as dyes. Moreover, substituted aryl benzo(thio)pyrylium salts as described in U.S. Pat. No. 3,881,924; trimethine thiopyrylium salts as described in JP-A-57-142645 (counterpart to U.S. Pat. No. 4,327,169); pyrylium based compounds as described in JP-A-58-181051, JP-A-58-220143, JP-A-59-41363, JP-A-59-84248, JP-A-59-84249, JP-A-59-146063, and JP-A-59-146061; cyanine coloring matters as described JP-A-59-216146; pentamethine thiopyrylium salts as described in U.S. Pat. No. 4,283,475; pyrylium compounds as described in JP-B-5-13514 and JP-B-5-19702; and commercially available products of Epolin Inc. including Epolight III-178, Epolight III-130 and Epolight III-125 are particularly preferably used.

Also, as other particularly preferable examples of dyes, can be enumerated near infrared absorbing dyes represented by the formulae (I) and (II) as described in U.S. Pat. No. 4,756,993.

These infrared absorbing dyes can be added to not only the upper thermosensitive layer but also the lower layer. By adding the infrared absorbing dye to the lower layer, it is possible to make the lower layer function as a thermosensitive layer, too. In the case where the infrared absorbing dye is added to the lower layer, infrared absorbing dyes the same as or different from those used in the upper thermosensitive layer may be used.

These infrared absorbing dyes may be added to the same layer containing other components, or may be added to a layer as separately provided. In the case where a separate layer is provided, it is desired to add the infrared absorbing dye to a layer adjacent to the thermosensitive layer. Further, though it is preferred to contain the dye and the alkali-soluble resin in the same layer, the both may be added to different layers from each other.

In the case of the upper thermosensitive layer, the dye can be added to a printing plate material in an addition amount of from 0.01 to 50% by weight, preferably from 0.1 to 30% by weight, and particularly preferably from 1.0 to 30% by weight based on the whole of solid contents of the printing plate material. When the addition amount of the dye is less than 0.01% by weight, sensitivity is low, whereas when it exceeds 50% by weight, uniformity of the upper thermosensitive layer is lost, whereby durability of the upper thermosensitive layer is deteriorated.

In the case of the lower layer, the dye can be added to a printing plate material in an addition amount of from 0 to 20% by weight, preferably from 0 to 10% by weight, and particularly preferably from 0 to 5% by weight based on the whole of solid contents of the lower layer. When the infrared absorbing dye is added to the lower layer, though dissolution of the lower layer is lowered, the addition of the infrared absorbing dye enables one to expect enhancement in dissolution of the lower layer due to heat during exposure. However, in a region of 0.2 to 0.3 μm in the vicinity of the support, enhancement in dissolution due to heat during exposure does not take place, and reduction in dissolution of the lower layer by the addition of the infrared absorbing dye is a factor for lowering the sensitivity. Accordingly, even in the previously specified range of the addition amount, an addition amount such that dissolution rate of the lower layer is less than 30 nm is not preferred.

[Other Additives]

In forming a lower layer of the positive working thermosensitive layer, besides the foregoing essential components, various additives can be added, if desired so far as the effects of the invention are not impaired. Also, in the upper thermosensitive layer, besides the foregoing essential components, various additives can be added, if desired so far as the effects of the invention are not impaired. The additives may be contained in only the lower layer, may be contained in only the upper thermosensitive layer, or may be contained in the both layers. Examples of additives will be hereunder described.

[Dissolution Inhibitor]

In the thermosensitive lithographic printing plate of the invention, various inhibitors can be contained in the image recording layer for the purpose of enhancing dissolution inhibition.

Inhibitors are not particularly limited, and examples include quaternary ammonium salts and polyethylene glycol based compounds.

Quaternary ammonium salts are not particularly limited, and examples include tetraalkylammonium salts, trialkylarylammonium salts, dialkyldiarylammonium salts, alkyltriarylammonium salts, tetraarylammonium salts, cyclic ammonium salts, and dicyclic ammonium salts.

Specific examples include tetrabutylammonium bromide, tetrapentylammonium bromide, tetrahexylammonium bromide, tetraoctylammonium bromide, tetralaruylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyltrimethylammonium bromide, and N-methylpyridium bromide. Especially, quaternary ammonium salts as described in Japanese Patent Application Nos. 2001-226297, 2001-370059 and 2001-398047 are preferable.

The addition amount of the quaternary ammonium salt is preferably from 0.1 to 50% by weight, and more preferably from 1 to 30% by weight in terms of solids content based on the whole of solid contents of the image recording layer. When the addition amount of the quaternary ammonium salt is less than 0.1% by weight, dissolution inhibition effect is low, and hence, such is not preferred. On the other hand, when it exceeds 50% by weight, film forming property of a binder may possibly be adversely affected.

Polyethylene glycol compounds are not particularly limited, and examples include those having the following structure.

$$R^1\text{—}\{\text{—O—}(R^3\text{—O—})_m\text{—}R^2\}_n$$

In the formula, $R^1$ represents a polyhydric alcohol residue or a polyhydric phenol residue; $R^2$ represents a hydrogen atom or an optionally substituted alkyl group, alkenyl group, alkynyl group, alkyloyl group, aryl group or acryloyl group each having from 1 to 25 carbon atoms; $R^3$ represents an optionally substituted alkylene residue; m is 10 or more in average; and n is an integer of 1 or more and not more 4.

Examples of polyethylene glycol compounds having the foregoing structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, propylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycolated ethylenediamines, polypropylene glycolated ethylenediamines, polyethylene glycolated diethylenetriamines, and polypropylene glycolated diethylenetriamines.

Specific examples of these polyethylene glycol compounds include polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic acid ester, polyethylene glycol lauryl ester, polyethylene glycol dilauryl ester, polyethylene glycol nonylic acid ester, polyethylene glycol cetylic acid ester, polyethylene glycol stearoyl ester, polyethylene glycol distearoyl ester, polyethylene glycol behenic acid ester, polyethylene glycol dibehenic acid ester, polypropylene glycol acetyl ester, polypropylene glycol diacetyl ester, polypropylene glycol benzoic acid ester, polypropylene glycol dibenzoic acid ester, polypropylene glycol lauric acid ester, polypropylene glycol dilauric acid ester, polypropylene glycol nonylic acid ester, polyethylene glycol glycerin ether, polypropylene glycol glycerin ether, polyethylene glycol sorbitol ether, polypropylene glycol sorbitol ether, polyethylene glycolated ethylenediamine, polypropylene glycolated ethylenediamine, polyethylene glycolated diethylenetriamine, polypropylene glycolated diethylenetriamine, and polyethylene glycolated pentamethylenehexamine.

The addition amount of the polyethylene glycol compound is preferably from 0.1 to 50% by weight, and more preferably from 1 to 30% by weight in terms of solids content based on the whole of solid contents of the thermosensitive layer (image recording layer). When the addition amount of the polyethylene glycol compound is less than 0.1% by weight, dissolution inhibition effect is low, and hence, such is not preferred. On the other hand, when it exceeds 50% by weight, the polyethylene glycol compound that cannot undergo mutual action with a binder accelerates penetration of the developing solution, thereby possibly adversely affecting image forming property.

Further, in the where measures for improving the dissolution inhibition are taken, sensitivity is lowered. However, in this case, it is effective to add a lactone compound. It may be considered that when the developing solution penetrates into exposed areas, the lactone compound reacts with the developing solution to newly form a carboxylic acid compound, which contributes to dissolution of the exposed areas, thereby enhancing the sensitivity.

Lactone compounds are not particularly limited, and examples include compounds represented by the following formulae (L-I) and (L-II).

Formula (L-I)

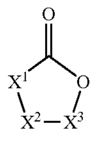

-continued

Formula (L-II)

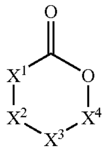

In the formulae (L-I) and (L-II), $X^1$, $X^2$, $X^3$ and $X^4$ each represents a ring-constituting atom or atomic group, may be the same or different and may independently have a substituent; and at least one of $X^1$, $X^2$ and $X^3$ in the formula (L-I) and at least one of $X^1$, $X^2$, $X^3$ and $X^4$ in the formula (L-II) each has an electron withdrawing substituent or a substituent substituted with an electron withdrawing group.

The ring-constituting atom or atomic group represented by $X^1$, $X^2$, $X^3$ and $X^4$ is a non-metallic atom having two single bonds for forming a ring or an atomic group containing such a non-metallic atom.

Preferred non-metallic atoms or non-metallic atomic groups are an atom or atomic group selected from a methylene group, a sulfinyl group, a carbonyl group, a thiocarbonyl group, a sulfonyl group, a sulfur atom, an oxygen atom, and a selenium group, and more preferably an atomic group selected from a methylene group, a carbonyl group, and a sulfonyl group.

At least one of $X^1$, $X^2$ and $X^3$ in the formula (L-I) and at least one of $X^1$, $X^2$, $X^3$ and $X^4$ in the formula (L-II) each has an electron withdrawing substituent. In this specification, the electron withdrawing substituent means a group taking a positive value of Hammett's substituent constant σp. With respect to the Hammett's substituent constant, for example, *Journal of Medicinal Chemistry,* 1973, Vol. 16, No. 11, 1207–1216 can be referred to. Examples of electron withdrawing groups taking a positive value of Hammett's substituent constant σp include halogen atoms (such as a fluorine atom (σp value: 0.06), a chlorine atom (σp value: 0.23), a bromine atom (σp value: 0.23), and an iodine atom (σp value: 0.18)), trihaloalkyl groups (such as tribromomethyl (σp value: 0.29), trichloromethyl (σp value: 0.33), and trifluoromethyl (σp value: 0.54)), a cyano group (σp value: 0.66), a nitro group (σp value: 0.78), aliphatic, aryl or heterocyclic sulfonyl group (such as methanesulfonyl (σp value: 0.72)), aliphatic, aryl or heterocyclic acyl groups (such as acetyl (σp value: 0.50) and benzoyl (σp value: 0.43)), alkynyl groups (such as C≡CH ((σp value: 0.23)), aliphatic, aryl or heterocyclic oxycarbonyl groups (such as methoxycarbonyl (σp value: 0.45) and phenoxycarbonyl (σp value: 0.44)), a carbamoyl group (σp value: 0.36), a sulfamoyl group (σp value: 0.57), a sulfoxide group, a heterocyclic group, an oxo group, and a phosphoryl group.

Preferred electron withdrawing groups are a group selected from an amide group, an azo group, a nitro group, a fluoroalkyl group having from 1 to 5 carbon atoms, a nitrile group, an alkoxycarbonyl group having from 1 to 5 carbon atoms, an acyl group having from 1 to 5 carbon atoms, an alkylsulfonyl group having from 1 to 9 carbon atoms, an arylsulfonyl group having from 6 to 9 carbon atoms, an alkylsulfinyl group having from 1 to 9 carbon atoms, an arylsulfinyl group having from 6 to 9 carbon atoms, an arylcarbonyl group having from 6 to 9 carbon atoms, a thiocarbonyl group, a fluorine-containing alkyl group having from 1 to 9 carbon atoms, a fluorine-containing aryl group having from 6 to 9 carbon atoms, a fluorine-containing allyl group having from 3 to 9 carbon atoms, an oxo group, and a halogen element.

More preferred electron withdrawing groups are a group selected from a nitro group, a fluoroalkyl group having from 1 to 5 carbon atoms, a nitrile group, an alkoxycarbonyl group having from 1 to 5 carbon atoms, an acyl group having from 1 to 5 carbon atoms, an arylsulfonyl group having from 6 to 9 carbon atoms, an arylcarbonyl group having from 6 to 9 carbon atoms, an oxo group, and a halogen element.

Specific examples of compounds represented by the formulae (L-I) and (L-II) will be given below, but it should not be construed that the invention is limited thereto.

(LI-1)

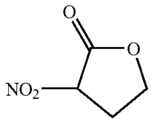

(LI-2)

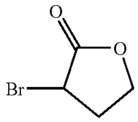

(LI-3)

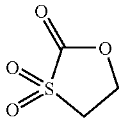

(LI-4)

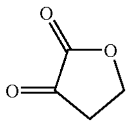

(LI-5)

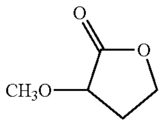

(LI-6)

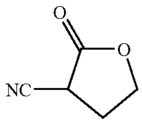

(LI-7)

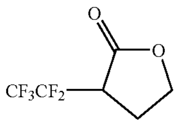

(LI-8)

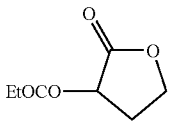

(LI-9)

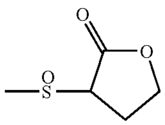

-continued (LI-10)

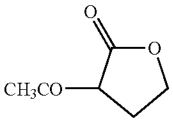

(LI-11)

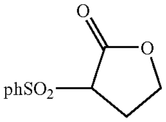

(LI-12)

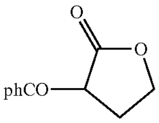

(LI-13)

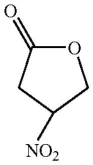

(LI-14)

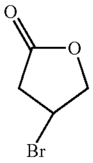

(LI-15)

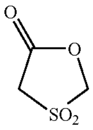

(LI-16)

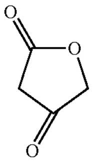

(LI-17)

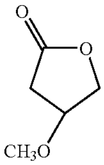

(LI-18)

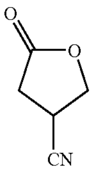

(LI-19)

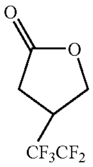

-continued (LI-20)

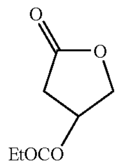

(LI-21)

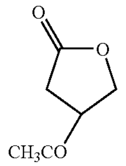

(LI-21)

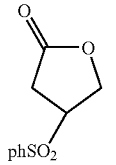

(LI-23)

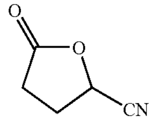

(LI-24)

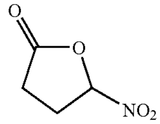

(LII-1)

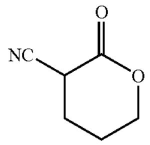

(LII-2)

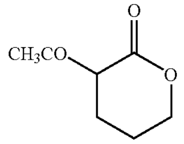

The addition amount of the compound represented by the formula (L-I) or (L-II) is preferably from 0.1 to 50% by weight, and more preferably from 1 to 30% by weight in terms of solids content based on the whole of solid contents of the thermosensitive layer. When the addition amount of the compound represented by the formula (L-I) or (L-II) is less than 0.1% by weight, the effect is low, whereas when it exceeds 50% by weight, image forming property is deteriorated. Incidentally, since this compound reacts with the developing solution, it is desired that it comes into selective contact with the developing solution.

These lactone compounds may be used alone or in combination. Further, two or more of compounds represented by the formula (L-I), or two or more of compounds represented by the formula (L-II), may be used in combination in an arbitrary ratio within the above-specified range in terms of the total addition amount.

Further, from the viewpoint of enhancing dissolution inhibition of image areas into the developing solution, it is preferred to jointly use substances that are heat decomposable and in a non-decomposed state, substantially reduce dissolution of the alkali-soluble high-molecular compound, such as onium salts, o-quinonediazide compounds, aromatic sulfone compounds, and aromatic sulfonic acid ester compounds. Examples of onium salts include diazonium salts, ammonium salts, phosphonium salts, iodonium salts, sulfonium salts, selenonium salts, and arsonium salts.

Suitable examples of onium salts that are used in the invention include diazonium salts as described in S. I. Schlesinger, *Photogr. Sci. Eng.,* 18, 387 (1974), T. S. Bal, et al., *Polymer,* 21, 423 (1980), and JP-A-5-158230; ammonium salts as described in U.S. Pat. Nos. 4,069,055 and 4,069,056 and JP-A-3-140140; phosphonium salts as described in D. C. Necker, et al., *Macromolecules,* 17, 2468 (1984), C. S. Wen, et al., *Teh, Proc. Conf. Rad. Curing, ASIA*, p. 478, Tokyo, October (1988), and U.S. Pat. Nos. 4,069,055 and 4,069,056; idonium salts as described in J. V. Crivello, et al., *Macromolecules,* 10(6), 1307 (1977), *Chem. & Eng. News*, November, 28, p. 31 (1988), European Patent No. 104,143, JP-A-2-150848, and JP-A-2-296514; sulfonium salts as described in J. V. Crivello, et al., *Polymer J.,* 17, 73 (1985), J. V. Crivello, et al., *J. Org. Chem.,* 43, 3055 (1978), W. R. Watt, et al., *J. Polymer Sci., Polymer Chem. Ed.,* 22, 1789 (1984), J. V. Crivello, et al., *Polymer Bull.,* 14, 279 (1985), J. V. Crivello, et al., *Macromolecules,* 14(5), 1141 (1981), J. V. Crivello, et al., *Polymer Sci., Polymer Chem. Ed.,* 17, 2877 (1979), European Patent Nos. 370,693, 233,567, 297,443 and 297,442, U.S. Pat. Nos. 4,933,377, 3,902,114, 4,760,013, 4,734,444 and 2,833,827, and German Patent Nos. 2,904,626, 3,604,580 and 3,604,581; selenonium salts as described in J. V. Crivello, et al., *Macromolecules,* 10(6), 1307 (1977) and J. V. Crivello, et al., *J. Polymer Sci., Polymer Chem. Ed.,* 17, 1047 (1979); and arsonium salts as described in C. S. Wen, et al., *Teh, Proc. Conf. Rad. Curing, ASIA*, p.478, Tokyo, October (1988).

Of the onium salts are particularly preferable diazonium salts. Further particularly suitable examples of diazonium salts are those as described in JP-A-5-158230.

Examples of counter ions of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesufonic acid, 2-fluorocaprylnaphthalenesulfonic acid, dodecylbenzenesulfonic acid, 1-naphthol-5-sulfonic acid, 2-methoxy-4-hydroxy-5-benzoyl-beznenesulfonic acid, and p-toluenesulfonic acid. Of these are particularly suitable hexafluorophosphoric acid, triisopropylnaphthalenesulfonic acid, and alkyl aromatic sulfonic acids such as 2,5-dimethylbenzenesulfonic acid.

Suitable examples of quinonediazides include o-quinonediazide compounds. The o-quinonediazide compound to be used in the invention is a compound containing at least one o-quinonediazide group, whose alkali solubility increases by heat decomposition, and compounds having various structures can be used. Namely, the o-quinonediazide assists dissolution of photosensitive materials due to both of an effect in which it loses dissolution inhibition of a binder by heat decomposition and an effect in which the o-quinonediazide itself converts into an alkali-soluble substance. Examples of o-quinonediazide compounds that are used in the invention include compounds as described in J. Kosar, *Light-Sensitive Systems*, pp. 339–352, John Wiley & Sons. Inc. Especially, sulfonic acid esters or sulfonic acid acids of o-quinonediazide reacted with various aromatic polyhydroxy compounds or aromatic amino compounds are suitable. Further, esters of benzoquinone-(1,2)-diazidosulfonic acid chloride or naphthoquinone-(1,2)-diazido-5-sulfonic acid chloride and a pyrrogallol-acetone resin as described in JP-B-43-28403 and esters of benzoquinone-(1,2)-diazidosulfonic acid chloride or naphthoquinone-(1,2)-diazido-5-sulfonic acid chloride and a phenol-formaldehyde resin as described in U.S. Pat. Nos. 3,046,120 and 3,188,210 are also suitably used.

In addition, esters of naphthoquinone-(1,2)-diazido-4-sulfonic acid chloride and a phenol-formaldehyde resin or a cresol-formaldehyde resin and esters of naphthoquinone-(1,2)-diazido-4-sulfonic acid chloride and a pyrrogallol-acetone resin are suitably used, too. Besides, useful o-quinonediazide compounds are reported in and known by various patents such as JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patent Nos. 1,227,602, 1,251,345, 1,267,005, 1,329,888 and 1,330,932, and German Patent No. 854,890.

The addition amount of the o-quinonediazide compound is preferably in the range of from 1 to 50% by weight, more preferably from 5 to 30% by weight, and particularly preferably from 10 to 30% by weight based on the whole of solid contents of the printing plate material. Such o-quinonediazide compounds may be used alone or in admixture.

For the purposes of enhancing dissolution inhibition of the thermosensitive layer surface and enhancing-resistance against scuffs on the surface, it is preferred to jointly use a polymer comprising a (meth)acrylate monomer having two or three perfluoroalkyl groups having from 3 to 20 carbon atoms in the molecule thereof as a polymerization component, as described in JP-A-2000-187318.

The addition amount of such a polymer is preferably from 0.1 to 10% by weight, and more preferably from 0.5 to 5% by weight in terms of a proportion occupying in the layer materials.

[Development Accelerator]

For the purpose of further enhancing the sensitivity, acid anhydrides, phenols, and organic acids can be used jointly.

As acid anhydrides, cyclic acid anhydrides are preferable. Specific examples of cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride, and pyromellitic anhydride, as described in U.S. Pat. No. 4,115,128. Examples of acyclic acid anhydrides include acetic anhydride.

Examples of phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

In addition, examples of organic acids include sulfonic acids, sulfinic acids, alkylsulfuric acids, phosphonic acids, phosphoric acid esters, and carboxylic acids, as described in JP-A-60-88942 and JP-A-2-96755. Specific examples include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 4-cyclohexene-1,2-dicarboxylic acid, erucic acid, laurylic acid, n-undecanoic acid, and ascorbic acid.

A proportion of the acid anhydrides, phenols or organic acids occupying in the printing plate material is preferably from 0.05 to 20% by weight, more preferably from 0.1 to 15% by weight, and particularly preferably from 0.1 to 10% by weight.

[Surfactant]

In the invention, for improving coating property and widening stability of processings against the development condition, nonionic surfactants as described in JP-A-62-251740 and JP-A-3-208514, ampholytic surfactants as described in JP-A-59-121044 and JP-A-4-13149, cyclohexane based compounds as described in European Patent No. 950,517, and fluorine-containing monomer copolymers as described in JP-A-62-170950, JP-A-11-288093, and Japanese Patent Application No. 2001-247351 can be added in the upper thermosensitive layer and lower layer.

Specific examples of nonionic surfactants include sorbitan tristearate, sorbitan monopalmitate, sorbitan trioleate, stearic acid monoglyceride, and polyoxyethylene nonylphenyl ether. Specific examples of ampholytic surfactants include alkyl di(aminoethyl) glycines, alkyl polyaminoethyl glycine hydrochlorides, 2-alkyl-N-carboxyethyl-N-hydroxyethyl imidazolium betaines, and N-tetradecyl-N,N-betaines (such as a trade name: Amogen K, manufactured by Daiichi Kogyo Seiyaku Co., Ltd.).

As cyclohexane based compounds, block copolymers of dimethylcycloxane and a polyalkylene oxide are preferable. Specific examples include polyalkylene oxide-modified silicones such as DBE-224, DBE-621, DBE-712, DBP-732 and DBP-534 (manufactured by Chisso Corporation) and Tego Glide 100 (manufactured by Tego Chemie Service GmbH, Germany).

A proportion of the nonionic surfactants or ampholytic surfactants occupying in the printing plate material is preferably from 0.01 to 15% by weight, more preferably from 0.01 to 5% by weight, and further preferably from 0.05 to 0.5% by weight.

[Printing-out Agent/Coloring Agent]

In the thermosensitive lithographic printing plate of the invention, printing-out agents for obtaining visible images immediately after heating by exposure and dyes or pigments as image coloring agents can be added in the upper thermosensitive layer and lower layer.

Representative examples of printing-out agents include combinations of a compound capable of releasing an acid upon heating by exposure (photo acid-releasing agent) and an organic dye capable of forming a salt. Specific examples include combinations of an o-naphthoquinonediazido-4-sulfonic acid halogenide and a salt-forming organic dye as described in JP-A-50-36209 and JP-A-53-8128 and combinations of a trihalomethyl compound and a salt-forming organic dye as described in JP-A-53-36223, JP-A-54-74728, JP-A-60-3626, JP-A-61-143748, JP-A-61-151644 and JP-A-63-58440. Examples of such trihalomethyl compounds include oxazole based compounds and triazine based compounds, and both of these compounds are excellent in stability with time and give distinct print-out images.

As image coloring agents, other dyes than the foregoing salt-forming organic dyes can be used. Examples of suitable dyes inclusive of salt-forming organic dyes include oil-soluble dyes and basic dyes. Specific examples include Oil Yellow #101, Oil Yellow #103, Oil Pink #312, Oil Green BG, Oil Blue BOS, Oil Blue #603, Oil Black BY, Oil Black BS and Oil Black T-505 (all being manufactured by Orient Chemical Industries, Ltd.), Victoria Pure Blue, Crystal Violet Lactone, Crystal Violet (CI42555), Methyl Violet (CI42535), Ethyl Violet, Rhodamine B (CI145170B), Malachite Green (CI42000), and Methylene Blue (CI52015). Further, dyes as described in JP-A-62-293247 are particularly preferable. These dyes are used in a proportion of from 0.01 to 10% by weight, and preferably from 0.1 to 3% by weight based on the whole of solid contents of the printing plate material.

[Plasticizer]

Further, for imparting flexibility of coating film, etc., if desired, plasticizers are added in the upper thermosensitive layer and lower layer of the thermosensitive lithographic printing plate of the invention. Examples include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

[Wax]

For the purpose of imparting resistance against scuffs, compounds capable of reducing a coefficient of static friction of the surface can be added in the upper thermosensitive layer and lower layer of the thermosensitive lithographic printing plate of the invention. Concretely, there can be enumerated compounds containing an ester of long chain alkylcarboxylic acid as described in U.S. Pat. No. 6,117,913 and Japanese Patent Application Nos. 2001-261627, 2002-032904 and 2002-165584.

A proportion of such a compound occupying in the materials constituting the layer is preferably from 0.1 to 10% by weight, and more preferably from 0.5 to 5% by weight.

In the thermosensitive lithographic printing plate of the invention, the upper thermosensitive layer and lower layer can be usually formed by dissolving the respective components in a solvent and coating the solution on an appropriate support.

Examples of solvents to be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and tolune. However, it should not be construed that the invention is limited thereto. These solvents may be used alone or in admixture.

Basically, as the solvent to be used for coating, it is preferred to select one having different dissolution against the alkali-soluble high-molecular compound used in the upper thermosensitive layer and against the alkali-soluble high-molecular compound used in the lower layer. For imparting a new function, it is also possible to positively perform partial compatibilizing.

Examples of methods of forming two layers separately include a method of utilizing a difference in solvent dissolution between the copolymer contained in the lower layer and the alkali-soluble resin contained in the thermosensitive layer and a method of coating the upper thermosensitive layer and then rapidly drying and removing the solvent. These methods will be described below in detail, but it should not be construed that the method of coating two layers separately is limited thereto.

The method of utilizing a difference in solvent dissolution between the copolymer contained in the lower layer and the alkali-soluble resin contained in the thermosensitive layer is a method of using a solvent in which any of a specific copolymer to be contained in the lower layer and a copolymer to be used jointly are insoluble during coating an alkaline aqueous solution-soluble resin. Thus, even in performing two-layer coating, it is possible to distinctly separate the respective layers to form a coating film. For example, two-layer coating can be performed by selecting a copolymer containing, as a copolymerization component, specific monomers constituting the lower layer component insoluble in a solvent capable of dissolving alkaline aqueous solution-soluble resins therein, such as methyl ethyl ketone and 1-methoxy-2-propanol; coating a lower layer composed mainly of the copolymer constituting the lower component using a solvent capable of dissolving the copolymer therein and then dying the lower layer; and thereafter coating an upper thermosensitive layer composed mainly of an alkaline aqueous solution-soluble resin using a solvent that does not dissolve the lower layer component therein, such as methyl ethyl ketone and 1-methoxy-2-propanol.

On the other hand, the method of drying the solvent extremely rapidly after coating the second layer can be attained by blowing high-pressure air from slit nozzles placed substantially perpendicular against the running direction of a web; giving heat energy as conduction heat from a lower surface of a web from a roller (heat roller) into which a heating medium such as vapor is fed; or a combination thereof.

As the method of performing partial compatibilizing between the two layers at a level where the layers thoroughly exhibit the effects of the invention, any of the method of utilizing a difference in solvent dissolution and the method of drying the solvent extremely rapidly after coating the second layer can be employed by adjusting its degree.

As coating solutions for coating on the support, those prepared by dissolving these components in an appropriate solvent are used. A concentration of the foregoing components (the whole of solid contents including the additives) in the solvent is preferably from 1 to 50% by weight. As a coating method, various methods can be employed. Examples include bar coater coating, rotary coating, spray coating, curtain coating, dip coating, air knife coating, blade coating, and roll coating.

For preventing damages to the lower layer during coating the upper thermosensitive layer, it is desired that the method of coating the upper thermosensitive layer is of a non-contact mode. Further, as a method that is of a contact mode but is generally used for coating of solvent systems, bar coater coating may be employed. But, for preventing damages to the lower layer, it is desired to perform coating by forward driving.

A coating amount of the whole of materials constituting the lower layer to be coated on the support of the thermosensitive lithographic printing plate is preferably in the range of from 0.5 to 4.0 $g/m^2$, and more preferably from 0.6 to 2.5 $g/m^2$. When the coating amount is less than 0.5 $g/m^2$, a reduction of printing resistance is likely caused. On the other hand, when it exceeds 4.0 $g/m^2$, image reproducibility is likely deteriorated, or sensitivity is likely lowered. Therefore, the both are not preferred.

A coating amount of the whole of materials constituting the upper thermosensitive layer is preferably in the range of from 0.05 to 1.0 $g/m^2$, and more preferably from 0.08 to 0.7 $g/m^2$. When the coating amount is less than 0.05 $g/m^2$, reductions in development latitude and scuffing resistance are likely caused. On the other hand, when it exceeds 1.0 $g/m^2$, sensitivity is likely lowered. Therefore, the both are not preferred.

The total coating amount of the upper and lower layers is preferably in the range of from 0.6 to 4.0 $g/m^2$, and more preferably from 0.7 to 2.5 $g/m^2$. When the total coating amount is less than 0.6 $g/m^2$, a reduction of printing resistance is likely caused. On the other hand, when it exceeds 4.0 $g/m^2$, image reproducibility is likely deteriorated, or sensitivity is likely lowered. Therefore, the both are not preferred.

[Support]

As the hydrophilic support that is used in the thermosensitive lithographic printing plate of the invention are enumerated dimensionally stable sheet-like materials having necessary strength and durability. Examples include papers, papers laminated with plastics (such as polyethylene, polypropylene, and polystyrene), metal sheets (such as aluminum, zinc, and copper), plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and papers or plastic films laminated or vapor deposited with the foregoing metals.

As the support of the invention, polyester films or aluminum sheets are preferable. Of these, relatively cheap aluminum sheets are particularly preferable. Suitable aluminum sheets are pure aluminum sheets and alloy sheets containing aluminum as a major component and trace amounts of foreign elements, and further, plastic films laminated or vapor deposited with aluminum may be employed. Examples of foreign elements contained in aluminum alloys include silicon, iron, manganese, copper, magnesium, chromium, zinc, bismuth, nickel, and titanium. The content of foreign elements in the alloy is at most 10% by weight.

In the invention, pure aluminum is particularly suitable. However, since it is difficult to produce completely pure aluminum from the standpoint of refining technology, those containing slightly foreign elements may be used.

Aluminum sheets that are applied in the invention are not specified with respect to their compositions, and those that have hitherto been known and used can be properly utilized. The aluminum sheets to be used in the invention have a thickness of from about 0.1 mm to 0.6 mm, preferably from 0.15 mm to 0.4 mm, and particularly preferably from 0.2 mm to 0.3 mm.

Prior to roughing the aluminum sheet, if desired, the aluminum sheet is subjected to degreasing processing with, for example, a surfactant, an organic solvent or an alkaline aqueous solution for the purpose of removing a rolling oil on the surface. The roughing processing of the surface of the aluminum sheet can be carried out by various methods such as a method of mechanically roughing the surface, a method of electrochemically dissolving and roughing the surface, and a method of chemically selectively dissolving the surface. As the mechanical method, known methods such as ball polishing, brush polishing, blast polishing, and buff polishing can be employed. As the electrochemical roughing method, a method of using an alternating current or direct current in a hydrochloric acid or nitric acid electrolytic solution can be employed. Further, a combination of the both methods as disclosed in JP-A-54-63902 can also be employed. The thus roughed aluminum sheet is subjected to alkali etching processing and neutralization processing as the need arises. Thereafter, if desired, the aluminum sheet is further subjected to anodic oxidation processing for the purpose of enhancing water retention and abrasion resistance of the surface. As electrolytes to be used for the anodic oxidation processing of the aluminum sheet, various electrolytes capable of forming a porous oxidized film can be used. In general, sulfuric acid, phosphoric acid, oxalic acid, chromic acid, or mixed acids thereof can be used. A concentration of such an electrolyte is properly determined depending on the kind of electrolyte.

The processing condition of the anodic oxidation varies depending on the electrolyte and hence, cannot be unequivocally specified. In general, it is proper that: the concentration of electrolyte is from 1 to 80% by weight, the liquid temperature is from 5 to 70° C., the current density is from 5 to 60 $A/dm^2$, the voltage is from 1 to 100 V, and the electrolysis time is from 10 seconds to 5 minutes. When the amount of the anodically oxidized film is less than 1.0 $g/m^2$, printing resistance is liable to be insufficient, or scuffs are likely formed in non-image areas of lithographic printing plate, whereby so-called "scuff stain" in which an ink easily adheres to scuffs during printing is likely generated. After the anodic oxidation processing, the aluminum surface is subjected to hydrophilic processing as the need arises. As the hydrophilic processing to be used in the invention, can be employed a method of using alkali metal silicates (such as a sodium silicate aqueous solution) as disclosed in U.S. Pat. Nos. 2,714,066, 3,181,461, 3,280,734 and 3,902,734. According to this method, the support is subjected to dip processing or electrolysis processing with a sodium silicate aqueous solution. Besides, there are employed a method of processing with potassium fluorozirconate as disclosed in JP-B-36-22063 and a method of processing with polyvinylphosphonic acid as disclosed in U.S. Pat. Nos. 3,276,868, 4,153,461 and 4,689,272.

In the thermosensitive lithographic printing plate to be applied to the invention, at least two layers of a positive working upper thermosensitive layer and a lower layer are laminated and provided on the support. An undercoating layer can be provided between the support and the lower layer as the need arises.

As components of the undercoating layer, various organic compounds are used. Examples include carboxymethyl cellulose; dextrin; gum arabic; amino group-containing phosphonic acids such as 2-aminoethylphosphonic acid; optionally substituted organic phosphonic acids such as phenylphosphonic acid, naphthylphosphonic acid, alkylphosphonic acids, glycerophosphonic acid, methylenediphosphonic acid, and ethylenediphosphonic acid; optionally substituted organic phosphoric acids such as phenylphosphoric acid, naphthylphosphoric acid, alkylphosphoric acids, and glycerophosphoric acid; optionally substituted organic phosphinic acids scuh as phenylphosphinic acid, naphthylphosphinic acid, alkylphosphinic acids, and glycerophosphinic acid; amino acids such as glycine and β-alanine; and hydroxyl group-containing amino hydrochlorides such as triethanolamine hydrochloride. These compounds may be used in admixture.

This organic undercoating layer can be provided in the following methods. That is, there are a method in which a solution of the organic compound dissolved in water or an organic solvent such as methanol, ethanol, and methyl ethyl ketone is coated on an aluminum sheet and dried to provide an organic undercoating layer; and a method in which an aluminum sheet is dipped in a solution of the organic compound dissolved in water or an organic solvent such as methanol, ethanol, and methyl ethyl ketone to adsorb the compound on the aluminum sheet, which is then rinsed with water, etc. and dried to provide an organic undercoating layer. In the former method, a solution of the organic compound having a concentration of from 0.005 to 10% by weight can be coated in various methods. In the latter method, the concentration of the solution is from 0.01 to 20% by weight, and preferably from 0.05 to 5% by weight; the dipping temperature is from 20 to 90° C., and preferably from 25 to 50° C.; and the dipping time is from 0.1 seconds to 20 minutes, and preferably from 2 seconds to one minute. It is possible to adjust the solution as used herein so as to have a pH in the range of from 1 to 12 with basic substances such as ammonia, triethylamine, and potassium hydroxide, or acidic substances such as hydrochloric acid and phosphoric acid. For improving tone reproducibility of image recording materials, yellow dyes may be added.

A coverage of the organic undercoating layer is suitably from 2 to 200 mg/m$^2$, and preferably from 5 to 100 mg/m$^2$. When the coverage is less than 2 mg/m$^2$, sufficient printing resistance cannot be obtained. When it exceeds 200 mg/m$^2$, sufficient printing resistance cannot be obtained, too.

A back coat is provided on the back surface of the support as the need arises. As such a back coat, coating layers made of an organic high-molecular compound as described in JP-A-5-45885 or of a metal oxide obtained by hydrolysis or polycondensation of an organic or inorganic metal compound as described in JP-A-6-35174 are preferably used. With respect to these coating layers, alkoxy compounds of silicon, such as $Si(OCH_3)_4$, $Si(OC_2H_5)_4$, $Si(OC_3H_7)_4$, and $Si(OC_4H_9)_4$, are cheap and readily commercially available, and coating layers made of a metal oxide obtained from such an alkoxy compound of silicon are excellent in resistance to developing solution and particularly preferable.

The thus prepared thermosensitive lithographic printing plate is imagewise exposed and then developed.

Examples of light sources of actinic rays to be used for imagewise exposure include mercury vapor lamps, metal halide lamps, xenon lamps, chemical lamps, and carbon arc lamps. Examples of radiations include electron beams, X-rays, ion beams, and far infrared rays. Further, g-lines, i-lines, deep-UV rays, and high-density energy beams (laser beams) are also useful. Examples of laser beams include helium-neon laser, argon laser, krypton laser, helium-cadmium laser, and KrF excimer laser. In the invention, light sources having an emitting wavelength in near infrared to infrared regions are preferable, and solid lasers and semiconductor lasers are particularly preferable.

[Alkaline Development Processing Step]

Alkaline development processing solutions that ate suitably used in the development step in the plate making method of the invention will be described below. The alkaline development processing solution contains a nonionic surfactant and a base and optionally other components.

(Nonionic Surfactant)

In the invention, by containing a nonionic surfactant in the alkaline development processing solution, even when development is performed using a solution having an enhanced development capability by increasing an alkali concentration, i.e., under over conditions, there give rise to advantages that dissolution resistance of image areas against the alkaline development processing solution is kept and that development stability against external scuffs are enhanced. It may be supposed that this is caused by a mutual action between the alkali-soluble high-molecular compound and the nonionic surfactant. This mutual action functions strongly in the case where the nonionic surfactant contains an ethylene oxide chain or propylene oxide chain, and functions particularly strongly in the case where the nonionic surfactant contains an ethylene oxide chain. It may be supposed that an alkali-soluble group, particularly a phenolic hydroxyl group strongly mutually acts with the ethylene oxide chain.

In the invention, the nonionic surfactant is not particularly limited, and any of conventionally known nonionic surfactants can be used. Examples include polyoxyethylene alkyl ethers, polyoxyethylene alkyphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol mono-fatty acid esters, sugar fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene castor oils, polyoxyethylene glycerin fatty acid partial esters, fatty acid diethanolamides, N,N-bis-2-hydroxyalkylamines, polyoxyethylene alkylamines, triethanolamine fatty acid esters, and trialkylamine oxides.

Specific examples of these nonionic surfactants include polyethylene glycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene phenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene nonyne ether, polyoxyethylene monolaurate, polyoxyethylene monostearate, polyoxyethylene glyceryl monooleate, polyoxyethylene glyceryl monostearate, polyoxyethylene propylene glycol monostearate, oxyethyleneoxypropylene block polymers, distyrenated phenol polyethylene oxide adducts, tribenzylphenol polyethylene oxide adducts, octylphenol polyoxyethylene polyoxypropylene adducts, glycerol monostearate, sorbitan monolaurate, and polyoxyethylene sorbitan monolaurate. With respect to the foregoing surfactants, the "polyoxyethylene" may be substituted with a polyoxyalkylene such as polyoxymethylene, polyoxypropylene, and polyoxybutylene, and such substitutes are also included in the surfactant.

The addition amount of the nonionic surfactant to the alkaline development processing solution is preferably from 0.001 to 5% by weight, more preferably from 0.01 to 3% by weight, and particularly preferably from 0.1 to 3% by weight. In the case where the addition amount of the nonionic surfactant is less than 0.001% by weight, the nonionic surfactant unlikely acts effectively. On the other hand, in the case where it exceeds 5% by weight, mutual action is too strong so that the development does not possibly proceed. The nonionic surfactant preferably has a weight average molecular weight of from 300 to 50,000, and particularly preferably from 500 to 5,000. These nonionic surfactants may be used singly or in admixture of two or more thereof.

In the invention, the nonionic surfactant is preferably a compound represented by the following formula (I).

$$R_1—O(CH_2CHR_2O)_l—(CH_2CHR_3O)_m—(CH_2CHR_4O)_n—R_5 \quad \text{Formula (I)}$$

In the formula (I), $R_1$ to $R_5$ each represents a hydrogen atom, an alkyl group, an alkenyl group, an alkynyl group or an aryl group each having from 1 to 18 carbon atoms, a carbonyl group, a carboxylate group, a sulfonyl group, or a sulfonate group; and l m and n each represents an integer of 0 or more, provided that all of l m and n do not represent 0 at the same time.

Specific examples of the alkyl group include a methyl group, an ethyl group, and a hexyl group; specific examples of the alkenyl group include a vinyl group and a propenyl group; specific examples of the alkynyl group include an acetyl group and a propynyl group; and specific examples of the aryl group include a phenyl group and a 4-hydroxyphenyl group.

Specific examples of compounds represented by the formula (I) include homopolymers such as polyethylene glycol and polypropylene glycol, and copolymers of ethylene glycol and propylene glycol. A ratio of the copolymer is preferably from 10/90 to 90/10 from the standpoint of consistence between dissolution in the developing solution and dissolution in the coating solvent. Further, among copolymers, graft polymers and block polymers are preferable from the standpoint of consistence between dissolution of non-image areas in the alkaline developing solution and dissolution resistance of image areas against the alkaline developing solution.

Of compounds represented by the formula (I), polyoxyethylene-polyoxypropylene block copolymers represented by the following formula (II) are particularly preferable from the standpoint of dissolution resistance of image areas against the alkaline developing solution.

$$HO—(C_2H_4O)_a—(C_3H_6O)_b—(C_2H_4O)_c—H \quad \text{Formula (II)}$$

In the formula (II), a, b and c each represents an integer of from 1 to 10,000. In the Invention, suitable polymers are those in which a proportion of oxyethylene in the total molecules is from 40 to 80% by weight, and preferably from 40 to 80% by weight. Those having a molecule weight of polyoxypropylene in the range of from 1,000 to 4,000, and preferably from 2,000 to 3,500 are particularly excellent.

(Base)

The alkaline development processing solution according to the invention contains a base as the major component. As the base, conventionally known alkaline agents such as inorganic alkaline agents and organic alkaline agents are enumerated. Examples of inorganic alkaline agents include sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, and ammonium borate.

Examples of organic alkaline agents include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

The bases may be used singly or in combination of two or more thereof. Of these bases are preferable sodium hydroxide and potassium hydroxide. This is because it is possible to adjust the pH over a wide pH region by adjusting the amount of the base. Further, trisodium phosphate, tripotassium phosphate, sodium carbonate, and potassium carbonate are preferable because they have buffer action themselves.

In the invention, for the purpose of enhancing developability, it is preferred to undergo processing under a so-called over condition by increasing the alkali concentration of the alkaline development processing solution. It may be possible to attain this purpose by adjusting the addition amount of the base. That is, the base may be added to the alkaline development processing solution such that the alkaline development processing solution becomes strongly alkaline, for example, at a pH of from 12.5 to 13.5, and preferably from 12.8 to 13.3.

(Other Components)

The alkaline development processing solution according to the invention may be a so-called "silicate developing solution" containing an alkali silicate as a base or containing one prepared by mixing a silicon compound with a base to form an alkali silicate in the system. Further, the alkaline development processing solution may be a so-called "non-silicate developing solution" not containing an alkali silicate but containing a non-reducing sugar and a base.

Alkali Silicate

Examples of alkali silicates include sodium silicate, potassium silicate, lithium silicate, and ammonium silicate. These alkali silicates may be used alone or in combination. An $SiO_2/M_2O$ molar ratio (wherein M represents an alkali metal) of the alkali silicate is preferably from 0.5 to 3.0, and particularly preferably from 1.0 to 2.0. When the $SiO_2/M_2O$ molar ratio exceeds 3.0, developability is liable to be lowered. On the other hand, when it is less than 0.5, since alkalinity increases, etching of a metal such as aluminum sheets that are widely used as a support of photosensitive lithographic printing plate precursors is liable to be adversely affected. A concentration of the alkali silicate in the silicate developing solution is preferably from 1 to 10% by weight, and particularly preferably from 1.5 to 7% by weight. When the concentration of the alkali silicate in the silicate developing solution exceeds 10% by weight, precipitation or formation of crystals likely occurs. Also, since gelation likely occurs in neutralization during liquid wasting, liquid wasting processing becomes complicated. On the other hand, when it is less than 1% by weight, development power or processing ability is lowered.

Non-reducing Sugar

When the infrared-sensitive lithographic printing plate precursor is developed with a so-called "non-silicate developing solution" not containing an alkali silicate but containing a non-reducing sugar and a base, it is possible to keep inking property of the photosensitive layer in a good state without causing deterioration of the surface of the photosensitive layer in the infrared-sensitive lithographic printing plate precursor. The infrared-sensitive lithographic printing plate precursor has narrow development latitude and is large in change of image line widths by pH of the developing solution. However, the non-silicate development solution contains a non-reducing sugar having buffer property for suppressing fluctuations of pH. Therefore, the non-silicate developing solution is advantageous as compared with development processing solutions containing a silicate. Additionally, since the non-reducing sugar hardly stains conductivity sensors or pH sensors for controlling liquid activity as compared with the silicate, the non-silicate developing solution is advantageous in this point.

The non-reducing sugar as referred to herein is a sugar free from a free aldehyde group or ketone group and not exhibiting reducibility and is classified into a trehalose type oligosaccharide comprising reducing groups bonded to each other, a glycoside comprising a reducing group of sugar and a non-sugar bonded to each other, and a reduced sugar-alcohol upon hydrolysis to a sugar. Any of these sugars can suitably be used in the invention. Incidentally, in the invention, non-reducing sugars as described in JP-A-8-305039 can suitably be used.

Examples of trehalose type oligosaccharides include saccharose and trehalose. Examples of glycosides include alkyl glycosides, phenol glycosides, and mustard oil glycosides. Examples of sugar-alcohols include D,L-arabitol, ribitol, xylitol, D,L-sorbitol, D,L-mannitol, D,L-iditol, D,L-talitol, dulcitol, and allodulcitol. In addition, maltitol hydrolyzed to maltose as a disaccharide and a reductant obtained by hydrolysis of oligosaccharide (reduced starch syrup) can suitably be enumerated. Of these non-reducing sugars are preferable trehalose type oligosaccharides and sugar-alcohols. Especially, D-sorbitol, saccharose, and reduced starch syrup are preferable because they have a buffer action in a proper pH region and are cheap.

In the invention, these non-reducing sugars may be used singly or in combination of two or more thereof. The content of the non-reducing sugar in the non-silicate developing solution is preferably from 0.1 to 30% by weight, and more preferably from 1 to 20% by weight. When the content the non-reducing sugar in the non-silicate developing solution is less than 0.1% by weight, sufficient buffer action is not obtained. On the other hand, when it exceeds 30% by weight, it is difficult to attain a high concentration, and a problem of an increase of the cost arises. As the base that is used in combination with the non-reducing sugar, those as enumerated previously can suitably be used. The content of the base to be used in the non-silicate developing solution is properly determined according to the desired pH and the kind and amount of the non-reducing sugar. Incidentally, when a reducing sugar is used in combination with the base, the reducing sugar becomes brown, its pH is lowered step by step, and developability is lowered. Accordingly, the reducing sugar is not preferable in the invention.

Also, in the invention, an alkali metal salt of a non-reducing sugar can be used as the major component in the non-silicate developing solution in place of the combination of a non-reducing sugar with a base. The alkali metal salt of a non-reducing sugar is obtained by mixing the non-reducing sugar and an alkali metal hydroxide and dehydrating the mixture upon heating at the melting point of the non-reducing sugar or higher, or by drying a mixed aqueous solution of the non-reducing sugar and an alkali metal hydroxide.

In the invention, an alkaline buffer solution comprising a weak acid other than the non-reducing sugar and a strong base can be used jointly in the non-silicate developing solution. As the weak acid, those having a dissociation constant (pKa) of from 10.0 to 13.2 are preferable. For examples, those described in *IONISATION CONSTANTS OF ORGANIC ACIDS IN AQUEOUS SOLUTION*, published by Pergamon Press can be selected.

Specific examples include alcohols such as tetrafluoropropanol (pKa: 12.74), trifluoroethanol (pKa: 12.37), and trichloroethanol (pKa: 12.24); aldehydes such as pryidine-2-aldehyde (pKa: 12.68) and pyridine-4-aldehydee (pKa: 12.05); phenolic hydroxyl group-containing compounds such as salicylic acid (pKa: 13.0), 3-hydroxy-2-napthoic acid (pKa: 12.84), catechol (pKa: 12.6), gallic acid (pKa: 12.4), sulfosalicyclic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrrogallol (pKa: 11.34), o-cresol (pKa: 10.33), resorcinol (pKa: 11.27), p-cresol (pKa: 10.27), and m-cresol (pKa: 10.09):

oximes such as 2-butanoxime (pKa: 12.45), acetoxime (pKa: 12.42), 1,2-cycloheptanedione dioxime (pKa: 12.3), 2-hydroxybenzaldehyde oxime (pKa: 12.10), dimethyl glyoxime (pKa: 11.9), ethanediamide dioxime (pKa: 11.37), and acetophenone oxime (pKa: 11.35); nucleic acid-related substances such as adenosine (pKa: 12.56), inosine (pKa: 12.5), guanine (pKa: 12.3), cytosine (pKa: 12.2), hypoxanthine (pKa: 12.1), and xanthine (pKa: 11.9); and others such as diethylaminomethylphosphonic acid (pKa: 12.32), 1-amino-3,3,3-trifluorobenzoic acid (pKa: 12.29), isopropylidene diphosphonic acid (pKa: 12.10), 1,1-ethylidene diphosphonic acid (pKa: 11.54), 1,1-ethylidene disphosphonic acid 1-hydroxy (pKa: 11.52), benzimidazole (pKa: 12.86), thiobenzamide (pKa: 12.8), picoline thioamide (pKa: 12.55), and barbituric acid (pKa: 12.5). Of these weak acids are preferable sulfosalicylic acid and salicylic acid.

Suitable examples of strong bases to be combined with such weak acids include sodium hydroxide, ammonium hydroxide, potassium hydroxide, and lithium hydroxide. These strong bases may be used singly or in combination of two or more thereof. Such a strong base is adjusted within a preferred range of pH according to the properly selected concentration and combination.

In the invention, for the purposes of accelerating developability, dispersing development scum, and enhancing ink-compatibility of image areas of thermosensitive lithographic printing plate precursor, development stabilizers, organic solvents, reducing agents, organic carboxylic acids, hard water softeners, and surfactants other than nonionic surfactants, and additionally known antiseptics, coloring agents, thickeners, and anti-foaming agents may be added as other components to the alkaline development processing solution as the need arises.

Development Stabilizer

Preferred examples of development stabilizers include polyethylene glycol adducts of sugar-alcohols, tetraalkylammonium salts such as tetrabutylammonium hydroxide, phosphonium salts such as tetrabutylphosphonium bromide, and idonium salts such as diphenyliodonium chloride as described in JP-A-6-282079. Further, anionic surfactants and ampholytic surfactants as described in JP-A-50-51324, water-soluble cationic polymers as described in JP-A-55-95946, and water-soluble ampholytic surfactants as described in JP-A-56-142528 are enumerated.

Additionally, there are enumerated organic boron compounds having an alkylene glycol added thereto as described in JP-A-59-84241; water-soluble surfactants of a polyoxyethylene-polyoxypropylene block polymer type as described in JP-A-60-111246; alkylenediamine compounds having polyoxyethylene-polyoxypropylene substituted thereon as described in JP-A-60-129750; polyethylene glycols having a weight average molecular weight of 300 or more as described in JP-A-61-215554; cationic group-containing fluorine-containing surfactants as described in JP-A-63-175858; water-soluble ethylene oxide addition compounds obtained by adding 4 moles or more of ethylene oxide to an acid or alcohol as described in JP-A-2-39157; and water-soluble polyalkylene compounds.

Organic Solvent

Organic solvents having a solubility in water of not more than about 10% by weight are preferable, and those having a solubility in water of not more than 5% by weight are more preferable. Specific examples of organic solvents include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine.

The content of the organic solvent in the alkaline development processing solution is from about 0.1 to 5% by weight based on the total weight of the alkaline development processing solution. The content of the organic solvent is closely related to the content of the surfactant in the alkaline development processing solution. It is preferred that the amount of the surfactant is increased with an increase of the amount of the organic solvent. This is because when the amount of the organic solvent is increased while reducing the amount of the surfactant, the organic solvent is not completely dissolved, so that it is impossible to expect to ensure good developability.

Reducing Agent

Examples of reducing agents include organic reducing agents and inorganic reducing agents. These reducing agents play a role to prevent printing plates from staining. Preferred examples of organic reducing agents include thiosalicylic acid, hydroquinone, methol, methoxyquinone, phenol compounds such as resorcin and 2-methylresorcin, and amines such as phenylenediamine and phenylhydrazine. Examples of inorganic reducing agents include sodium salts, potassium salts and ammonium salts of inorganic acids such as sulfurous acid, hydrosulfurous acid, phosphorous acid, hydrophosphorous acid, dihydrophosphorous acid, thiosulfuric acid, and dithionous acid. Of these are preferable sulfites because they are particularly excellent in stain-preventing effect. The content of the reducing agent in the alkaline development processing solution is from about 0.05 to 5% by weight based on the total weight of the alkali development processing solution.

Organic Carboxylic Acid

Examples of organic carboxylic acids include aliphatic carboxylic acids and aromatic carboxylic acids each having from 6 to 20 carbon atoms. Specific examples of aliphatic carboxylic acids having from 6 to 20 carbon atoms include caproic acid, enanthylic acid, caprylic acid, lauric acid, myristic acid, palmitic acid, and stearic acid. Of these are particularly preferable alkanonic acids having from 8 to 12 carbon atoms. These aliphatic carboxylic acids may be unsaturated fatty acids having a double bond in the carbon chains thereof or have a branched carbon chain.

Examples of aromatic carboxylic acids having from 6 to 20 carbon atoms include compounds in which a carboxyl group is substituted on a benzene ring, a naphthalene ring, or an anthracen ring. Specific examples include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Of these is particularly preferable hydroxynaphthoic acid.

The aliphatic carboxylic acid and aromatic carboxylic acid are preferably used in the form of a sodium salt, a potassium salt, or an ammonium salt from the viewpoint of enhancing water-solubility. The content of the organic carboxylic acid in the alkaline development processing solution is not particularly limited but is usually from about 0.1 to 10% by weight, and preferably from 0.5 to 4% by weight. When the content of the organic carboxylic acid in the alkaline development processing solution is less than 0.1% by weight, its addition effect is not sufficient. On the other hand, when it exceeds 10% by weight, not only an effect corresponding thereto is not seen, but also dissolution of other additives into the alkaline development processing solution to be used jointly may possibly be disturbed.

Hard Water Softener

Examples of hard water softeners include polyphosphoric acids and sodium salts, potassium salts and ammonium salts thereof; aminopolycarboxylic acids (scuh as ethylenediamintetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraaceetic acid) and sodium salts, potassium salts and ammonium salts thereof; and aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid) and 1-hydroxyethane-1,1-diphosphonic acid and sodium salts, potassium salts and ammonium salts thereof.

An optimum content of the hard water hardener in the alkaline development processing solution varies depending upon its chelating power and the hardness and amount of hard water to be used. But, the content of the hard water softener is in general from about 0.01 to 5% by weight, and preferably from 0.01 to 0.5% by weight. When the content of the hard water softener is less than 0.1% by weight, its addition effect may possibly be insufficient. On the other hand, when it exceeds 5% by weight, adverse influences to image areas such as decolorization may possibly be generated.

Other Surfactants

In the invention, anionic surfactants, cationic surfactants, ampholytic surfactants, and fluorine based surfactants may further be added to the alkaline development processing solution in addition to the nonionic surfactants.

Suitable examples of anionic surfactants include fatty acid salts, abietic acid salts, hydroxyalkanesulfonic acid satls, alkanesulfonic acid salts, dialkylsulfosuccinic acid ester salts, α-olefin sulfonic acid salts, linear alkylbenzenesulfonic acid salts, branched chain alkylbenzenesulfonic acid salts, alkylnaphthalenesulfonic acid salts, alkylphenoxypolyoxyethylenepropylsulfonic acid salts, polyoxyethylenealkylsulfophenyl ether salts, N-methyl-N-oleyltaurine sodium salt, N-alkylsulfosuccinic acid monoamide disodium salts, petroleum sulfonic acid salts, sulfated beef tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, partially saponified products of styrene/maleic anhydride copolymers, partially saponified products of olefin/maleic anhydride copolymers, and naphthalenesulfonic acid salt-formalin condensates.

Examples of cationic surfactants include alkylamine salts, quaternary ammonium salts such as tetrabutylammonium bromide, polyoxyethylene alkylamine salts, and polyethylene-polyamine derivatives. Examples of ampholytic surfactants include carboxybetaines, alkylaminocarboxylic acids, sulfobetaines, aminosulfuric acid esters, and imidazolines.

The fluorine based surfactant contains a perfluoroalkyl group in the molecule thereof. Examples of such fluorine based surfactants include anionic types such as perfluoroalkylcarboxylic acid salts, perfluoroalkylsulfonic acid salts, and perfluoroalkylphosphoric acid esters; ampholytic types such as perfluoroalkylbetaines; cationic types such as perfluoroalkyltrimethylammonium salts; and nonionic types such as perfluoroalkylamine oxides, perfluoroalkyl ethylene oxide adducts, oligomers containing a perfluoroalkyl group and a hydrophilic group, oligomers containing a perfluoroalkyl group and an oleophilic group, oligomers containing a perfluoroalkyl group, a hydrophilic group and an oleophilic group, and urethanes containing a perfluoroalkyl group and an oleophilic group.

With respect to the foregoing surfactants, the "polyoxyethylene" may be substituted with a polyoxyalkylene such as polyoxymethylene, polyoxypropylene, and polyoxybutylene, and such substitutes are also included in the surfactant. These surfactants may be used singly or in combination of two or more thereof. The content of the surfactant in the alkaline development processing solution is usually from 0.001 to 10% by weight, and preferably from 0.01 to 5% by weight.

The alkali development processing solution contains water other than the foregoing respective components. In the invention, it is advantageous from the standpoint of transportation that when not used (stored), the alkaline development processing solution is formed as a concentrated solution having a low content of water, and when used, it is diluted with water. In this case, a degree of concentration of the alkaline development processing solution is properly selected such that the respective components do not cause separation or deposition.

The printing plate thus developed with the developing solution and a replenisher is subjected to post treatment with, for example, washing water, a rinse solution containing a surfactant, and a desensitizing solution containing gum arabic and starch derivatives. As the post treatment in the plate making method of the lithographic printing plate of the invention, these treatments can be employed through various combinations.

In recent years, in the industries of plate making and printing, for the purposes of rationalization and standardization, an automatic processor for printing plate is widely used. Such an automatic processor generally includes a development section and a post treatment section and further includes a unit for conveying a printing plate and respective processing solution tanks and spray units, in which an exposed printed plate is conveyed horizontally and developed while spraying each of processing solutions drawn up by a pump from spray nozzles. Further, recently, there is also known a method in which a printing plate is processed in a processing solution tank filled with a processing solution while dipping and conveying by guide rollers. In such automatic processing, the processing can be performed while replenishing a replenisher to each processing solution according to the processing amount and operation time. Moreover, a so-called non-returnable processing system of treating with a substantially virgin processing solution can also be applied.

In the invention, in the case where a lithographic printing plate obtained by imagewise exposing, developing and water washing and/or rinsing and/or gumming includes unnecessary image areas (for example, film edge marks of original image film), the unnecessary image areas are erased. For achieving erasion, it is preferred to employ a method in which an erasing solution as described in JP-B-2-13293 is coated on unnecessary image areas, and the coated unnecessary image areas are allowed to stand for a while as they are and then washed with water. Also, there can be utilized a method in which unnecessary image areas are irradiated with actinic rays introduced through an optical fiber and then developed as described in JP-A-59-174842.

The thus obtained lithographic printing plate can be provided for printing step after coating a desensitizing gum, if desired. In the case where a lithographic printing plate is required to have higher printing resistance, the lithographic printing plate is subjected to burning processing. In the case where a lithographic printing plate is subjected to burning processing, it is preferred to treat the lithographic printing plate with a surface conditioning solution as described in JP-B-61-2518, JP-B-55-28062, JP-A-62-31859 and JP-A-61-159655 prior to the burning processing. Examples of methods of performing such processing include a method in which a surface conditioning solution is coated on a lithographic printing plate using a sponge or absorbent cotton impregnated with the surface conditioning solution, a method in which the lithographic printing plate is dipped in a vat filled with a surface conditioning solution and coated with the surface conditioning solution, and a method in which a surface conditioning solution is coated using an automated coater. Further, what a coating amount is made uniform after coating by a squeegee or a squeegee roller gives rise more preferred results.

A suitable coating amount of the surface conditioning solution is in general from 0.03 to 0.8 $g/m^2$ (on a dry weight). The surface conditioning solution-coated lithographic printing plate is heated at high temperatures by a burning processor (for example, a burning processor "BP-1300", sold by Fuji Photo Film Co., Ltd.), etc. after drying, as the need arises. In this case, the heating temperature and time vary depending on the kind of components forming an image, and the heating is preferably carried out at from 180 to 300° C. for from 1 to 20 minutes.

If desired, the burning processed lithographic printing plate can be properly subjected to conventionally employed processings such as water-washing and gumming. In the case where a surface conditioning solution containing a water-soluble high-molecular compound is used, so-called desensitizing processing such as gumming can be omitted. The lithographic printing plate thus obtained through such processings is fixed in an offset printer and used for producing a number of prints.

EXAMPLES

The Invention will be described below with reference to the following Examples, but it should not be construed that the scope of the invention is limited thereto.

[Preparation of Thermosensitive Lithographic Printing Plate Precursor]

Example 1

[Preparation 1 of Substrate]

A 0.24 mm-thick aluminum sheet (an aluminum alloy containing 0.06% by weight of Si, 0.30% by weight of Fe, 0.014% by weight of Cu, 0.001% by weight of Mn, 0.001% by weight of Mg, 0.001% by weight of Zn, and 0.03% by weight of Ti, with the remainder being Al and inevitable impurities) was subjected continuously to the following processings.

The aluminum sheet was subjected to continuous electrochemical roughing processing using an alternating current of 60 Hz. At this time, an electrolytic solution was an aqueous solution of 10 g/L of nitric acid (containing 5 g/L of aluminum ion and 0.007% by weight of ammonium ion) at a temperature of 80° C. After water washing, the aluminum sheet was subjected to etching processing by spraying a solution having a sodium hydroxide concentration of 26% by weight and an aluminum ion concentration of 6.5% by weight to dissolve 0.20 g/$m^2$ of the aluminum sheet, followed by washing with water by spraying. Thereafter, the aluminum sheet was subjected desmutting processing by spraying an aqueous solution having a sulfuric acid concentration of 25% by weight (containing 0.5% by weight of aluminum ion) at a temperature of 60° C. and washed with water by spraying.

The aluminum sheet was subjected to anodic oxidation processing using an anodic oxidation system by two-stage feeding electrolysis processing. Sulfuric acid was used as an electrolytic solution to be supplied in an electrolysis section. Thereafter, the aluminum sheet was washed with water by spraying. A final amount of oxidized film was 2.7 g/$m^2$.

The aluminum support obtained by anodic oxidation processing was treated with an alkali metal silicate (silicate processing) by dipping in a processing bath containing a 1% by weight aqueous solution of No. 3 sodium silicate at a temperature of 30° C. for 10 seconds. Thereafter, the aluminum support was washed with water by spraying.

An undercoating solution having the following composition was coated on the thus obtained aluminum support after treatment with an alkali metal silicate and dried at 80° C. for 15 seconds to form a coating film. After drying, the coating film had a coverage of 15 mg/$m^2$.

| <Composition of undercoating solution> | |
|---|---|
| Compound as described below: | 0.3 g |
| Methanol: | 100 g |
| Water: | 1 g |

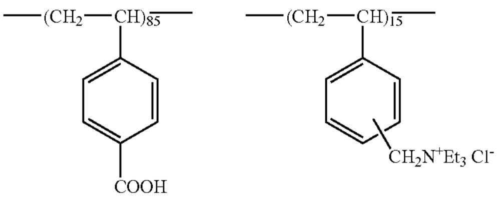

Molecular weight: 28,000

On the obtained web-form substrate, the following coating solution 1 for lower layer was coated by a bar coater such that the coating amount was 0.85 g/$m^2$, dried at 178° C. for 35 seconds, and immediately thereafter, cooled by cold air at from 17 to 20° C. until the temperature of the support became 35° C. Thereafter, the following coating solution 1 for upper thermosensitive layer was coated on the support by a bar coater such that the coating amount was 0.22 g/$m^2$, and the support was then dried at 149° C. for 20 seconds and gradually cooled with an air of from 20 to 26° C., to prepare a thermosensitive lithographic printing plate 1.

| [Coating solution 1 for lower layer] | |
|---|---|
| N-(4-Aminosulfonylphenyl)methacrylamide/acrylonitrile/methyl methacrylate (36/34/30, weight average molecular weight: 50,000, acid value: 2.65): | 2.133 g |
| Cyanine dye A (having a structure as described below): | 0.134 g |
| 4,4'-Bishydroxyphenylsulfone: | 0.126 g |
| Tetrahydrophthalic anhydride: | 0.190 g |
| p-Toluenesulfonic acid: | 0.008 g |
| 3-Methoxy-4-diazodiphenylamine hexafluorophosphate: | 0.032 g |
| Ethyl Violet whose counter ion is changed to 6-hydroxynaphthalenesulfone: | 0.781 g |
| Polymer 1 (having a structure as described below): | 0.035 g |
| Methyl ethyl ketone: | 25.41 g |
| 1-Methoxy-2-propanol: | 12.97 g |
| γ-Butyrolactone: | 13.18 g |

Cyanine dye A

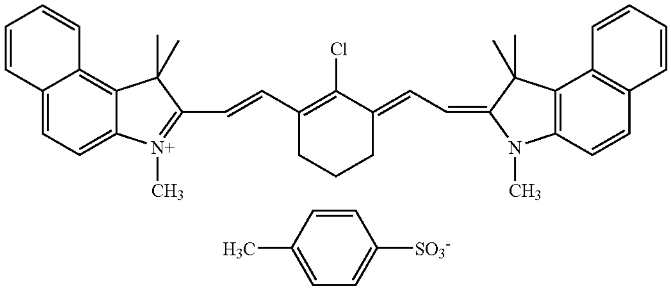

-continued

| [Coating solution 1 for lower layer] |
| --- |

Polymer 1

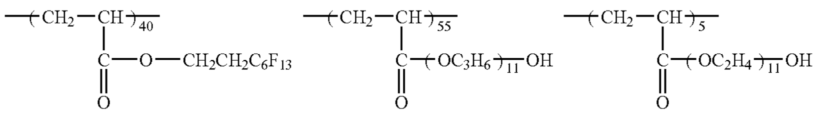

| [Coating solution 1 for upper thermosensitive layer] | |
| --- | --- |
| m,p-Cresol novolak (m/p ratio: 6/4, weight average molecular weight: 4,500, containing 0.8% by weight of unreacted cresols): | 0.3479 g |
| Cyanine dye A (having a structure as described above): | 0.0192 g |
| 30% MEK solution of ethyl methacrylate/isobutyl methacrylate/acrylic acid copolymer (37/37/26% by weight): | 0.1403 g |
| Polymer 1 (having a structure as described above): | 0.015 g |
| Polymer 2 (having a structure as described below): | 0.00328 g |
| Methyl ethyl ketone: | 10.39 g |
| 1-Methoxy-2-propanol: | 20.78 g |

Polymer 2

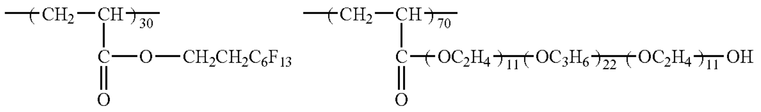

In the thermosensitive lithographic printing plate 1, by partially compatibilizing the lower layer during coating the upper thermosensitive layer, fine protrusions were generated on the surface of the upper thermosensitive layer. The components of the upper thermosensitive layer portion were analyzed. As a result, the N-(4-aminosulfonylphenyl)methacrylamide/acrylonitrile/methyl methacrylate copolymer that had been added to the lower layer was detected. The number of protrusions per 100 $\mu m^2$ on a photograph taken by an electron microscope with a magnification of 5,000 times was counted. As a result, 40 protrusions were observed in a proportion of 0.4 per $\mu m^2$.

Example 2

A thermosensitive lithographic printing plate 2 was prepared in the same manner as in Example 1, except for changing the coating solution 1 for upper thermosensitive layer in Example 1 to a coating solution 2 for upper thermosensitive layer as described below.

| [Coating solution 2 for upper thermosensitive layer] | |
| --- | --- |
| m,p-Cresol novolak (m/p ratio: 6/4, weight average molecular weight: 4,500, containing 0.8% by weight of unreacted cresols): | 0.3478 g |
| Cyanine dye A (having a structure as described above): | 0.0192 g |
| Ammonium compound used in Example 2 of Japanese Patent Application No. 2001-398047: | 0.0115 g |

-continued

| [Coating solution 2 for upper thermosensitive layer] | |
| --- | --- |
| Megaface F-176 (20%) (a surface improving surfactant, manufactured by Dainippon Ink and Chemicals, Incorporated): | 0.022 g |
| Methyl ethyl ketone: | 13.07 g |
| 1-Methoxy-2-propanol: | 6.79 g |

In the thermosensitive lithographic printing plate 2, by partially compatibilizing the lower layer during coating the upper thermosensitive layer, fine protrusions were generated on the surface of the upper thermosensitive layer. The components of the upper thermosensitive layer portion were analyzed. As a result, the N-(4-aminosulfonylphenyl)methacrylamide/acrylonitrile/methyl methacrylate copolymer that had been added to the lower layer was detected. The number of protrusions per 100 $\mu m^2$ on a photograph taken by an electron microscope with a magnification of 5,000 times was counted. As a result, 120 protrusions were observed in a proportion of 1.2 per $\mu m^2$.

Example 3

A thermosensitive lithographic printing plate 3 was prepared in the same manner as in Example 1, except for changing the coating solution 1 for upper thermosensitive layer in Example 1 to a coating solution 3 for upper thermosensitive layer as described below.

| [Coating solution 3 for upper thermosensitive layer] | |
|---|---|
| m,p-Cresol novolak (m/p ratio: 6/4, weight average molecular weight: 4,500, containing 0.8% by weight of unreacted cresols): | 0.3479 g |
| Cyanine dye A (having a structure as described above): | 0.0192 g |
| Nipol SX1302 (manufactured by Zeon Corporation, styrene particles, mean particle size: 0.12 μm): | 0.015 g |
| 30% MEK solution of ethyl methacrylate/isobutyl methacrylate/acrylic acid copolymer (37/37/26% by weight): | 0.1403 g |
| Megaface F-176 (20%) (a surface improving surfactant, manufactured by Dainippon Ink and Chemicals, Incorporated): | 0.022 g |
| Megaface MCF-312 (20%) (manufactured by Dainippon Ink and Chemicals, Incorporated): | 0.011 g |
| 1-Methoxy-2-propanol: | 19.86 g |

In the thermosensitive lithographic printing plate 3, by adding fine particles during coating the upper thermosensitive layer, fine protrusions were generated on the surface of the upper thermosensitive layer. The number of protrusions per 100 $\mu m^2$ on a photograph taken by an electron microscope with a magnification of 5,000 times was counted. As a result, 30 protrusions were observed in a proportion of 0.3 per $\mu m^2$.

Comparative Example 1

A thermosensitive lithographic printing plate 4 was prepared in the same manner as in Example 1, except for changing the coating solution 1 for upper thermosensitive layer in Example 1 to a coating solution 4 for upper thermosensitive layer as described below.

| [Coating solution 4 for upper thermosensitive layer] | |
|---|---|
| m,p-Cresol novolak (m/p ratio: 6/4, weight average molecular weight: 4,500, containing 0.8% by weight of unreacted cresols): | 0.3478 g |
| Cyanine dye A (having a structure as described above): | 0.0192 g |
| Ammonium compound used in Example 2 of Japanese Patent Application No. 2001-398047: | 0.0115 g |
| Megaface F-176 (20%) (a surface improving surfactant, manufactured by Dainippon Ink and Chemicals, Incorporated): | 0.022 g |
| 1-Methoxy-2-propanol: | 19.86 g |

In the thermosensitive lithographic printing plate 4, the lower layer was not compatibilized during coating the upper thermosensitive layer. Fine protrusions were not observed on the surface of the upper thermosensitive layer.

Comparative Example 2

A thermosensitive lithographic printing plate 5 was prepared in the same manner as in Example 1, except for changing the coating solution 1 for upper thermosensitive layer in Example 1 to a coating solution 5 for upper thermosensitive layer as described below.

| [Coating solution 5 for upper thermosensitive layer] | |
|---|---|
| m,p-Cresol novolak (m/p ratio: 6/4, weight average molecular weight: 4,500, containing 0.8% by weight of unreacted cresols): | 0.3479 g |
| Cyanine dye A (having a structure as described above): | 0.0192 g |
| Nipol LX407BF6 (manufactured by Zeon Corporation, organic pigment particles, mean particle size: 0.2 μm): | 0.005 g |
| 30% MEK solution of ethyl methacrylate/isobutyl methacrylate/acrylic acid copolymer (37/37/26% by weight): | 0.1403 g |
| Megaface F-176 (20%) (a surface improving surfactant, manufactured by Dainippon Ink and Chemicals, Incorporated): | 0.022 g |
| Megaface MCF-312 (20%) (manufactured by Dainippon Ink and Chemicals, Incorporated): | 0.011 g |
| 1-Methoxy-2-propanol: | 19.86 g |

In the thermosensitive lithographic printing plate 5, by adding fine particles during coating the upper thermosensitive layer, fine protrusions were generated on the surface of the upper thermosensitive layer. The number of protrusions per 100 $\mu m^2$ on a photograph taken by an electron microscope with a magnification of 5,000 times was counted. As a result, 3 protrusions were observed in a proportion of 0.03 per $\mu m^2$.

Example 4

A thermosensitive lithographic printing plate 6 was prepared in the same manner as in Example 1, except for changing the preparation method substrate in Example 1 to the following preparation 2 of substrate.

[Preparation 2 of Substrate]

A 0.3 mm-thick aluminum sheet (material quality: JIS A1050) was subjected to etching processing with a solution of having a sodium hydroxide concentration of 30 g/L and an aluminum ion concentration of 10 g/L at a liquid temperature of 60° C. for 10 seconds, washed with running water, neutralized and rinsed with 10 g/L nitric acid, and then washed with water. The aluminum sheet was subjected electrochemical roughing processing in an aqueous solution having a hydrogen chloride concentration of 15 g/L and an aluminum ion concentration of 10 g/L at a liquid temperature of 30° C. using a sine-wave alternating waveform current under a condition of an applied voltage Va of 20 V at an electrical quantity of 500 c/$dm^2$ and washed with water. Subsequently, the aluminum sheet was subjected to etching processing with a solution of having a sodium hydroxide concentration of 30 g/L and an aluminum ion concentration of 10 g/L at a liquid temperature of 40° C. for 10 seconds and washed with running water. Thereafter, the aluminum sheet was subjected to desmutting processing in a sulfuric acid aqueous solution having a sulfuric acid concentration of 15% by weight at a liquid temperature of 30° C. and washed with water. Further, the aluminum sheet was subjected to anodic oxidation processing in a 10% by weight sulfuric acid aqueous solution at a liquid temperature of 20° C. by a direct current under a condition of a current density of 6 A/$dm^2$ such that the amount of an anodically oxidized film was corresponding to 2.5 g/$m^2$, and then washed with water to prepare a support (I). The support (I) was measured with respect to center line average roughness (Ra) using a stylus having a diameter of 2 μm and found to be 0.55 μm.

In the thermosensitive lithographic printing plate 6, by partially compatibilizing the lower layer during coating the upper thermosensitive layer, fine protrusions were generated on the surface of the upper thermosensitive layer. The components of the upper thermosensitive layer portion were analyzed. As a result, the N-(4-aminosulfonylphenyl)-methacrylamide/acrylonitrile/methyl methacrylate copolymer that had been added to the lower layer was detected. The number of protrusions per 100 $\mu m^2$ on a photograph taken by an electron microscope with a magnification of 5,000 times was counted. As a result, 52 protrusions were observed in a proportion of 0.52 per $\mu m^2$.

Example 5

A thermosensitive lithographic printing plate 7 was prepared in the same manner as in Example 1, except for changing the preparation method substrate in Example 1 to the following preparation 3 of substrate.

[Preparation 3 of Substrate]

A 0.3 mm-thick aluminum sheet (Fe: 0.3%, Si: 0.08%, Cu: 0.001%, Ti: 0.015%) was subjected to roughing processing with a pumice muddy solution having a median diameter of 25 μm (specific gravity: 1.1 g/cm$^3$) using three brushes having a filling diameter of 0.3 mm (number of revolutions: 250 rpm for the first brush, 200 rpm for the second brush, 200 rpm for the third brush) and then subjected to etching processing with a sodium hydroxide aqueous solution having a sodium hydroxide concentration of 26% and an aluminum ion concentration of 5% such that the dissolution amount of Al was 10 g/m$^2$. The aluminum sheet was washed with running water, neutralized and rinsed with a 1% nitric acid aqueous solution, and washed with water. The aluminum sheet was subjected to electrical roughing processing with a nitric acid aqueous solution having a nitric acid concentration of 1% and an Al ion concentration of 0.5% at an electrical quantity of 175 c/dm$^2$. Thereafter, the aluminum sheet was subjected to etching processing with a sodium hydroxide aqueous solution having a sodium hydroxide concentration of 26% and an aluminum ion concentration of 5% such that the dissolution amount of Al was 0.5 g/m$^2$, washed with running water, neutralized and rinsed with a 25% sulfuric acid aqueous solution, and then washed with water.

Subsequently, the aluminum sheet was subjected to electrical roughing processing with a hydrochloric acid aqueous solution having a hydrochloric acid concentration of 0.5% and an Al ion concentration of 0.5% at an electrical quantity of 50 c/dm$^2$. Thereafter, the aluminum sheet was subjected to etching processing with a sodium hydroxide aqueous solution having a sodium hydroxide concentration of 5% and an aluminum ion concentration of 0.5% such that the dissolution amount of Al was 0.1 g/m$^2$, washed with running water, neutralized and rinsed with a 25% sulfuric acid aqueous solution, and then washed with water.

Further, the aluminum sheet was subjected to continuous direct current electrolysis with a sulfuric acid aqueous solution having a sulfuric acid concentration of 15% and an Al ion concentration of 0.5% by direct current electrolysis such that the amount of an anodically oxidized film was 2.5 g/m$^2$, to prepare a roughed substrate for lithographic printing plate.

In the thermosensitive lithographic printing plate 7, by partially compatibilizing the lower layer during coating the upper thermosensitive layer, fine protrusions were generated on the surface of the upper thermosensitive layer. The components of the upper thermosensitive layer portion were analyzed. As a result, the N-(4-aminosulfonylphenyl)methacrylamide/acrylonitrile/methyl methacrylate copolymer that had been added to the lower layer was detected. The number of protrusions per 100 $\mu m^2$ on a photograph taken by an electron microscope with a magnification of 5,000 times was counted. As a result, 60 protrusions were observed in a proportion of 0.6 per $\mu m^2$.

[Sensitivity Evaluation]

The thus obtained thermosensitive lithographic printing plates 1 to 7 were measured with respected to sensitivity in the following manner.

Each of the thermosensitive lithographic printing plates was drawn with a solid image using Trendsetter (manufactured by Creo Inc.) at a beam strength in the range of from 2 to 10 W and at a drum rotation speed of 150 rpm and then developed using a PS processor, LP940H (manufactured by Fuji Photo Film Co., Ltd.) charged with a developing solution, DT-2 (manufactured by Fuji Photo Film Co., Ltd.) (diluted at 1/8) and a finisher, FG-1 (manufactured by Fuji Photo Film Co., Ltd.) while keeping a liquid temperature at 30° C. for 12 seconds. At this time, the developing solution had a conductivity of 43 mS/cm.

After the development, the printing plate was observed by a loupe with a magnification of 25 times, and the presence or absence of a residual film at a level at which printing staining did not substantially occur was evaluated. Then, an actual exposure energy was calculated from an exposure beam intensity at which no residual film was observed and defined as a sensitivity. It is evaluated that the smaller the exposure energy, the higher the sensitivity is.

[Evaluation of Scuffing Resistance]

In each of the obtained thermosensitive lithographic printing plates 1 to 7, the plate was scratched using a HEIDON's scratch tester while applying a load to a sapphire stylus (tip diameter: 1.0 nm), and immediately thereafter, was developed using a PS processor, LP940H (manufactured by Fuji Photo Film Co., Ltd.) charged with a developing solution, DT-2 (manufactured by Fuji Photo Film Co., Ltd.) (diluted at 1/8) and a finisher, FG-1 (manufactured by Fuji Photo Film Co., Ltd.) while keeping a liquid temperature at 30° C. for 12 seconds. At this time, the developing solution had a conductivity of 43 mS/cm. A load at which no scuff could be visually observed was defined as a value of scuffing resistance. It is evaluated that the larger the numerical value, the more excellent the scuff resistance is.

[Evaluation of Development Latitude]

Each of the obtained thermosensitive lithographic printing plates 1 to 7 was imagewise drawn with a test pattern using Trendsetter (manufactured by Creo Inc.) at a beam strength of 9 W and at a drum rotation speed of 150 rpm and then developed using a PS processor, LP940H (manufactured by Fuji Photo Film Co., Ltd.) charged with a solution obtained by diluting a developing solution, DT-2R (manufactured by Fuji Photo Film Co., Ltd.) at 1/5 and blowing a carbon dioxide gas thereinto until the conductivity reached 37 mS/cm and a finisher, FG-1 (manufactured by Fuji Photo Film Co., Ltd.) while keeping a liquid temperature at 30° C. for 12 seconds. Thereafter, a suitable amount of DR-2R (diluted at 1/5) was added to the developing solution to adjust the conductivity at 39 mS/cm, and the thermosensitive lithographic printing plate in which a test pattern had been imagewise drawn similarly was developed. Further, the conductivity was increased by 2 mS/cm each, and this operation was continued until film diminishment due to development of the image was remarkably observed.

At this time, with respect to the printing plate developed at each of the conductivities, the presence or absence of staining or coloration caused by residual film of the thermosensitive layer due to development failure was confirmed, and a conductivity of the developing solution at which the development could be performed well was determined. Next, a critical conductivity at which the development film diminishment was kept in a level such that printing resistance was not substantially influenced was determined.

A width between the conductivity of the developing solution at which the development could be performed well and the critical conductivity at which the development film diminishment was kept in a level such that printing resistance was not substantially influenced was defined as development latitude.

The evaluation results of the thermosensitive lithographic printing plates 1 to 7 are shown in Table 1.

TABLE 1

| | Thermosensitive lithographic printing plate | Sensitivity ($mJ/cm^2$) | Scuffing resistance | Development latitude (mS/cm) | Number of protrusions ($number/\mu m^2$) |
|---|---|---|---|---|---|
| Example 1 | 1 | 65 | 9 g | 37–47 | 0.4 |
| Example 2 | 2 | 65 | 10 g | 37–49 | 1.2 |
| Example 3 | 3 | 70 | 7 g | 39–51 | 0.3 |
| Comparative Example 1 | 4 | 85 | 4 g | 39–47 | 0 |
| Comparative Example 2 | 5 | 83 | 3 g | 39–47 | 0.03 |
| Example 4 | 6 | 65 | 9 g | 37–49 | 0.5 |
| Example 5 | 7 | 70 | 9 g | 37–49 | 0.6 |

By containing fine protrusions caused by unevennesses of an upper thermosensitive layer in a proportion of 0.1 or more and not more than 7 per $\mu m^2$ on the surface of the upper thermosensitive layer, the thermosensitive lithographic printing plate of the invention has excellent development latitude during image formation and has high sensitivity and excellent scuffing resistance.

[Preparation of Thermosensitive Lithographic Printing Plate Precursor]

Examples 2-1 to 2-6 and Comparative Example 2-1

[Preparation of Substrate]

A 0.24 mm-thick aluminum sheet (an aluminum alloy containing 0.06% by weight of Si, 0.30% by weight of Fe, 0.014% by weight of Cu, 0.001% by weight of Mn, 0.001% by weight of Mg, 0.001% by weight of Zn, and 0.03% by weight of Ti, with the remainder being Al and inevitable impurities) was subjected continuously to the following processings.

The aluminum sheet was subjected to continuous electrochemical roughing processing using an alternating current of 60 Hz. At this time, an electrolytic solution was an aqueous solution of 10 g/L of nitric acid (containing 5 g/L of aluminum ion and 0.007% by weight of ammonium ion) at a temperature of 80° C. After water washing, the aluminum sheet was subjected to etching processing by spraying a solution having a sodium hydroxide concentration of 26% by weight and an aluminum ion concentration of 6.5% by weight to dissolve 0.20 g/$m^2$ of the aluminum sheet, followed by washing with water by spraying. Thereafter, the aluminum sheet was subjected desmutting processing by spraying an aqueous solution having a sulfuric acid concentration of 25% by weight (containing 0.5% by weight of aluminum ion) at a temperature of 60° C. and washed with water by spraying.

The aluminum sheet was subjected to anodic oxidation processing using an anodic oxidation system by two-stage feeding electrolysis processing. Sulfuric acid was used as an electrolytic solution to be supplied in an electrolysis section. Thereafter, the aluminum sheet was washed with water by spraying. A final amount of oxidized film was 2.7 g/$m^2$.

The aluminum support obtained by anodic oxidation processing was treated with an alkali metal silicate (silicate processing) by dipping in a processing bath containing a 1% by weight aqueous solution of No. 3 sodium silicate at a temperature of 30° C. for 10 seconds. Thereafter, the aluminum support was washed with water by spraying.

An undercoating solution having the following composition was coated on the thus obtained aluminum support after treatment with an alkali metal silicate and dried at 80° C. for 15 seconds to form a coating film. After drying, the coating film had a coverage of 15 mg/$m^2$.

<Composition of undercoating solution>

| | |
|---|---|
| Compound as described below: | 0.3 g |
| Methanol: | 100 g |
| Water: | 1 g |

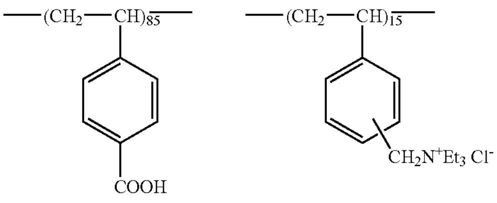

Molecular weight: 28,000

On the obtained web-form substrate, the following coating solution 2-1 for lower layer was coated by a bar coater such that the coating amount was 0.85 g/$m^2$, dried at 178° C. for 35 seconds, and immediately thereafter, cooled by cold air at from 17 to 20° C. until the temperature of the support became 35° C. Thereafter, the following coating solution 2-1 for upper thermosensitive layer was coated on the support by a bar coater such that the coating amount was 0.22 g/$m^2$, and the support was then dried at 149° C. for 20 seconds and gradually cooled with an air of from 20 to 26° C. There were thus prepared thermosensitive lithographic printing plates 2-1 to 2-7.

| [Coating solution 2-1 for lower layer] | |
|---|---|
| N-(4-Aminosulfonylphenyl)methacrylamide/acrylonitrile/methyl methacrylate (36/34/30, weight average molecular weight: 50,000, acid value: 2.65): | 2.133 g |
| Cyanine dye A (having a structure as described above): | 0.134 g |
| 4,4'-Bishydroxyphenylsulfone: | 0.126 g |
| Tetrahydrophthalic anhydride: | 0.190 g |
| p-Toluenesulfonic acid: | 0.008 g |
| 3-Methoxy-4-diazodiphenylamine hexafluorophosphate: | 0.032 g |
| Ethyl Violet whose counter ion is changed to 6-hydroxynaphthalenesulfone: | 0.781 g |
| Polymer 1 (having a structure as described above): | 0.035 g |
| Methyl ethyl ketone: | 25.41 g |
| 1-Methoxy-2-propanol: | 12.97 g |
| γ-Butyrolactone: | 13.18 g |
| [Coating solution 2-1 for upper thermosensitive layer] | |
| m,p-Cresol novolak (m/p ratio: 6/4, weight average molecular weight: 4,500, containing 0.8% by weight of unreacted cresols): | 0.3479 g |

-continued

| | |
|---|---|
| Alkali-soluble high-molecular compound as shown in Table 2-1: | 0.0462 g |
| Cyanine dye A (having a structure as described above): | 0.0192 g |
| 30% MEK solution of ethyl methacrylate/isobutyl methacrylate/acrylic acid copolymer (37/37/26% by weight): | 0.1403 g |
| Polymer 1 (having a structure as described above): | 0.015 g |
| Polymer 2 (having a structure as described above): | 0.00328 g |
| Methyl ethyl ketone: | 10.39 g |
| 1-Methoxy-2-propanol: | 20.78 g |

[Dissolution Speed of Alkali-soluble Resin]

The dissolution speed of alkali-soluble resin was measured in the following manner. That is, each alkali-soluble resin was coated in a thickness of 1.6 μm on a silicon wafer, and its dissolution speed in DT-1 (diluted at 1/8) was measured using DRM manufactured by Litho Tech Japan Corp. (Model: RDA-790EB). As a result, the m,p-cresol novolak (m/p ratio: 6/4) used in Example 2-1 had a dissolution speed of 100 nm/s. Dissolution speeds of the alkali-soluble resins as used in other Examples are shown in Table 2-1.

TABLE 2-1

| | Lithographic printing plate | Alkali-soluble high-molecular compound |
|---|---|---|
| Example 2-1 | 1 | 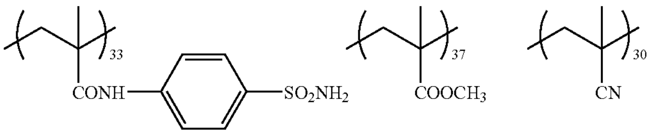 |
| Example 2-2 | 2 | 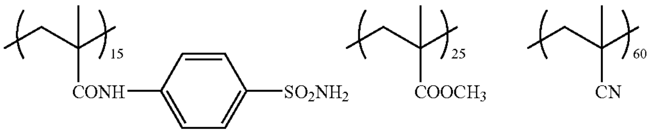 |
| Example 2-3 | 3 | 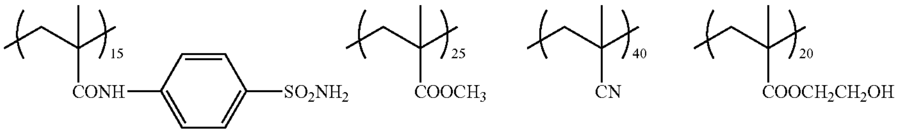 |
| Example 2-4 | 4 | 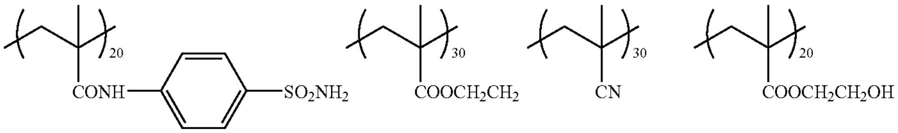 |
| Example 2-5 | 5 | 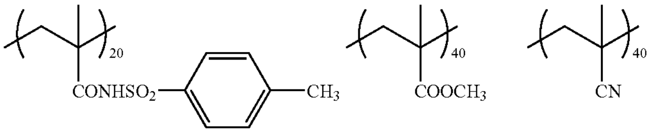 |
| Example 2-6 | 6 | 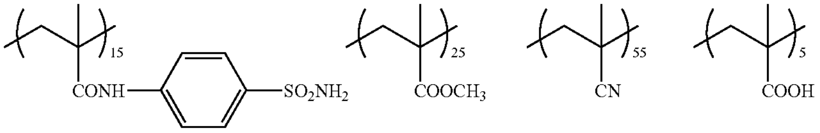 |

TABLE 2-1-continued

| | | |
|---|---|---|
| Comparative Example 2-1 | 7 | No |

| | Weight average molecular weight | Dissolution speed (nm/s) |
|---|---|---|
| Example 2-1 | 50000 | 210 |
| Example 2-2 | 47000 | 130 |
| Example 2-3 | 38000 | 146 |
| Example 2-4 | 47000 | 120 |
| Example 2-5 | 50000 | 151 |
| Example 2-6 | 43000 | 158 |
| Comparative Example 2-1 | | — |

Examples 2-7 to 2-9

Thermosensitive lithographic printing plates 2-8 to 2-10 of Examples 2-7 to 2-9 were prepared in the same manner as in Examples 2-1 to 2-6, except for replacing the mechanical roughing processing of substrate used in Examples 2-1 to 2-6 with the following electrochemical roughing processing.

[Electrochemical Roughing Processing]

A 0.3 mm-thick aluminum sheet (material quality: JIS A1050) was subjected to etching processing with a solution of having a sodium hydroxide concentration of 30 g/L and an aluminum ion concentration of 10 g/L at a liquid temperature of 60° C. for 10 seconds, washed with running water, neutralized and rinsed with 10 g/L nitric acid, and then washed with water. The aluminum sheet was subjected electrochemical roughing processing in an aqueous solution having a hydrogen chloride concentration of 15 g/L and an aluminum ion concentration of 10 g/L at a liquid temperature of 30° C. using a sine-wave alternating waveform current under a condition of an applied voltage Va of 20 V at an electrical quantity of 500 c/$dm^2$ and washed with water. Subsequently, the aluminum sheet was subjected to etching processing with a solution of having a sodium hydroxide concentration of 30 g/L and an aluminum ion concentration of 10 g/L at a liquid temperature of 40° C. for 10 seconds and washed with running water. Thereafter, the aluminum sheet was subjected to desmutting processing in a sulfuric acid aqueous solution having a sulfuric acid concentration of 15% by weight at a liquid temperature of 30° C. and washed with water. Further, the aluminum sheet was subjected to anodic oxidation processing in a 10% by weight sulfuric acid aqueous solution at a liquid temperature of 20° C. by a direct current under a condition of a current density of 6 A/$dm^2$ such that the amount of an anodically oxidized film was corresponding to 2.5 g/$m^2$, and then washed with water to prepare a support (2-I). The support (2-I) was measured with respect to center line average roughness (Ra) using a stylus having a diameter of 2 μm and found to be 0.55 μm.

Examples 2-10 to 2-12 and Comparative Example 2-2

Thermosensitive lithographic printing plates 2-11 to 2-14 of Examples 2-10 to 2-12 and Comparative Example 2-2 were prepared in the same manner as in Examples 2-4 to 2-6, except for replacing the mechanical roughing processing of substrate used in Examples 2-4 to 2-6 and Comparative Example 2-1 with the following mechanical roughing processing.

[Mechanical Roughing Processing]

A 0.3 mm-thick aluminum sheet (Fe: 0.3%, Si: 0.08%, Cu: 0.001%, Ti: 0.015%) was subjected to roughing processing with a pumice muddy solution having a median diameter of 25 μm (specific gravity: 1.1 g/$cm^3$) using three brushes having a filling diameter of 0.3 mm (number of revolutions: 250 rpm for the first brush, 200 rpm for the second brush, 200 rpm for the third brush) and then subjected to etching processing with a sodium hydroxide aqueous solution having a sodium hydroxide concentration of 26% and an aluminum ion concentration of 5% such that the dissolution amount of aluminum was 10 g/$m^2$. The aluminum sheet was washed with running water, neutralized and rinsed with a 1% nitric acid aqueous solution, and washed with water. The aluminum sheet was subjected to electrical roughing processing with a nitric acid aqueous solution having a nitric acid concentration of 1% and an aluminum ion concentration of 0.5% at an electrical quantity of 175 c/$dm^2$. Thereafter, the aluminum sheet was subjected to etching processing with a sodium hydroxide aqueous solution having a sodium hydroxide concentration of 26% and an aluminum ion concentration of 5% such that the dissolution amount of Al was 0.5 g/$m^2$, washed with running water, neutralized and rinsed with a 25% sulfuric acid aqueous solution, and then washed with water.

Subsequently, the aluminum sheet was subjected to electrical roughing processing with a hydrochloric acid aqueous solution having a hydrochloric acid concentration of 0.5% and an aluminum ion concentration of 0.5% at an electrical quantity of 50 c/$dm^2$. Thereafter, the aluminum sheet was subjected to etching processing with a sodium hydroxide aqueous solution having a sodium hydroxide concentration of 5% and an aluminum ion concentration of 0.5% such that the dissolution amount of aluminum was 0.1 g/$m^2$, washed with running water, neutralized and rinsed with a 25% sulfuric acid aqueous solution, and then washed with water.

Further, the aluminum sheet was subjected to continuous direct current electrolysis with a sulfuric acid aqueous solution having a sulfuric acid concentration of 15% and an aluminum ion concentration of 0.5% by direct current electrolysis such that the amount of an anodically oxidized film was 2.5 g/$m^2$, to prepare a roughed substrate for lithographic printing plate.

[Sensitivity Evaluation]

The thus obtained thermosensitive lithographic printing plates 2-1 to 2-14 were measured with respected to sensitivity in the following manner.

Each of the thermosensitive lithographic printing plates 2-1 to 2-14 was drawn with a solid image using Trendsetter (manufactured by Creo Inc.) at a beam strength in the range of from 2 to 10 W and at a drum rotation speed of 150 rpm and then developed using a PS processor, LP940H (manufactured by Fuji Photo Film Co., Ltd.) charged with a developing solution, DT-2 (manufactured by Fuji Photo Film Co., Ltd.) (diluted at 1/8) and a finisher, FG-1 (manufactured by Fuji Photo Film Co., Ltd.) while keeping a liquid temperature at 30° C. for 12 seconds. At this time, the developing solution had a conductivity of 45 mS/cm.

After the development, the printing plate was observed by a loupe with a magnification of 50 times. Then, an actual exposure energy (mJ/cm$^2$) was calculated from an exposure beam intensity at which no dot-like residual film was observed and defined as a sensitivity. It is evaluated that the smaller the exposure energy, the higher the sensitivity is.

[Evaluation of Development Latitude]

Each of the obtained thermosensitive lithographic printing plates 2-1 to 2-14 was imagewise drawn with a test pattern using Trendsetter (manufactured by Creo Inc.) at a beam strength of 9 W and at a drum rotation speed of 150 rpm and then developed using a PS processor, LP940H (manufactured by Fuji Photo Film Co., Ltd.) charged with a solution obtained by diluting a developing solution, DT-2R (manufactured by Fuji Photo Film Co., Ltd.) at 1/5 and blowing a carbon dioxide gas thereinto until the conductivity reached 37 mS/cm and a finisher, FG-1 (manufactured by Fuji Photo Film Co., Ltd.) while keeping a liquid temperature at 30° C. for 12 seconds. Thereafter, a suitable amount of DR-2R (diluted at 1/5) was added to the developing solution to adjust the conductivity at 39 mS/cm, and the thermosensitive lithographic printing plate in which a test pattern had been imagewise drawn similarly was developed. Further, the conductivity was increased by 2 mS/cm each, and this operation was continued until film diminishment due to development of the image was remarkably observed.

At this time, with respect to the printing plate developed at each of the conductivities, the presence or absence of staining or coloration caused by residual film of the thermosensitive layer due to development failure was confirmed, and a conductivity of the developing solution at which the development could be performed well was determined. Next, a critical conductivity at which the development film diminishment was kept in a level such that printing resistance was not substantially influenced was determined.

A width between the conductivity of the developing solution at which the development could be performed well and the critical conductivity at which the development film diminishment was kept in a level such that printing resistance was not substantially influenced was defined as development latitude.

The evaluation results are shown in Table 2-2.

TABLE 2-2

| | Lithographic printing plate | Sensitivity (mJ/cm$^2$) | Development latitude (image forming range) |
|---|---|---|---|
| Example 2-1 | 1 | 70 | 39–47 mS/cm |
| Example 2-2 | 2 | 65 | 39–47 mS/cm |
| Example 2-3 | 3 | 65 | 39–45 mS/cm |
| Example 2-4 | 4 | 70 | 39–51 mS/cm |
| Example 2-5 | 5 | 70 | 39–49 mS/cm |

TABLE 2-2-continued

| | Lithographic printing plate | Sensitivity (mJ/cm$^2$) | Development latitude (image forming range) |
|---|---|---|---|
| Example 2-6 | 6 | 65 | 39–47 mS/cm |
| Comparative Example 2-1 | 7 | 110 | 41–45 mS/cm |
| Example 2-7 | 8 | 65 | 39–47 mS/cm |
| Example 2-8 | 9 | 70 | 39–49 mS/cm |
| Example 2-9 | 10 | 70 | 39–47 mS/cm |
| Example 2-10 | 11 | 60 | 39–45 mS/cm |
| Example 2-11 | 12 | 70 | 39–47 mS/cm |
| Example 2-12 | 13 | 75 | 39–47 mS/cm |
| Comparative Example 2-2 | 14 | 115 | 41–45 mS/cm |

It is noted from the results of Table 2-2 that in the case where the thermosensitive lithographic printing plate of the invention is used, sensitivity is excellent.

According to the invention, it is possible to obtain a thermosensitive lithographic printing plate for direct plate making, having excellent development latitude during image formation and high sensitivity to infrared laser.

This application is based on Japanese Patent application JP 2003-038525, filed Feb. 17, 2003, and Japanese Patent application JP 2003-038526, filed Feb. 17, 2003, the entire contents of those are hereby incorporated by reference, the same as if set forth at length.

What is claimed is:

1. A thermosensitive lithographic printing plate comprising:

a hydrophilic support;

a lower layer comprising a water-insoluble and alkali-soluble resin; and an upper thermosensitive layer comprising a water-insoluble and alkali-soluble resin and an infrared absorbing dye, whose dissolution in an alkaline aqueous solution increases upon exposure, wherein a surface of the upper thermosensitive layer has protrusions caused by ununiformity of thickness of the upper thermosensitive layer in a proportion of 0.1 or more and not more than 7 per μm$^2$, wherein said protrusions caused by ununiformity of thickness of the upper thermosensitive layer on the surface of the upper thermosensitive layer are formed as a result of a method of using a blend of a high-molecular compound to be used in the upper thermosensitive layer with two or more kinds of phase-separating high-molecular compounds, where said phase-separating high-molecular compounds are uniformly dissolved in a solution but cause separation during coating and drying, whereby one of said two or more kinds of phase-separation high-molecular compounds in a lower amount by weight causes phase separation spherically.

2. The thermosensitive lithographic printing plate according to claim 1, wherein the upper thermosensitive layer comprises a granular substance as measures for forming protrusions caused by ununiformity of thickness of the upper thermosensitive layer on the surface of the upper thermosensitive layer.

3. The thermosensitive lithographic printing plate according to claim 1, wherein the upper thermosensitive layer comprises an alkali-soluble resin which is the same as the alkali-soluble resin contained in the lower layer.

4. The thermosensitive lithographic printing plate according to claim 1, wherein both of the resins in the lower layer and the upper thermosensitive layer comprise a functional group selected from the group consisting of a phenolic hydroxyl group, a sulfonamide group and an active imido group.

5. The thermosensitive lithographic printing plate according to claim 1, wherein the proportion is 0.2 or more and not more than 3 per $\mu m^2$.

6. The thermosensitive lithographic printing plate according to claim 1, wherein the upper thermosensitive layer comprises at least two alkali-soluble resins having a different dissolution speed in an alkaline aqueous solution from each other, and the at least two alkali-soluble resins cause phase separation from each other.

7. The thermosensitive lithographic printing plate according to claim 6, wherein the upper thermosensitive layer comprises an alkali-soluble resin which is the same as the alkali-soluble resin contained in the lower layer.

8. The thermosensitive lithographic printing plate according to claim 6, wherein each of the resins in the lower layer and the upper thermosensitive layer comprises a functional group selected from the group consisting of a phenolic hydroxyl group, a sulfonamide group and an active imido group.

9. The thermosensitive lithographic printing plate according to claim 6, wherein the at least two alkali-soluble resins comprises a resin having a phenolic hydroxyl group and a resin having a sulfonamide group or an active imido group.

* * * * *